(12) United States Patent
Ozeki et al.

(10) Patent No.: US 11,121,297 B2
(45) Date of Patent: Sep. 14, 2021

(54) METHOD OF MANUFACTURING LIGHT EMITTING DEVICE THAT INCLUDES A FIRST REFLECTING LAYER AND A SECOND REFLECTING LAYER

(71) Applicant: Nichia Corporation, Anan (JP)

(72) Inventors: Kenji Ozeki, Tokushima (JP); Atsushi Kojima, Tokushima (JP); Chinami Nakai, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/455,620

(22) Filed: Jun. 27, 2019

(65) Prior Publication Data

US 2020/0006608 A1 Jan. 2, 2020

(30) Foreign Application Priority Data

Jun. 29, 2018 (JP) .............................. JP2018-124545
Mar. 22, 2019 (JP) .............................. JP2019-055625

(51) Int. Cl.
*H01L 33/60* (2010.01)
*H01L 33/48* (2010.01)
(Continued)

(52) U.S. Cl.
CPC ............ *H01L 33/60* (2013.01); *H01L 33/486* (2013.01); *H01L 33/507* (2013.01); *H01L 33/56* (2013.01);
(Continued)

(58) Field of Classification Search
CPC ......... H01L 33/50; H01L 33/52; H01L 33/56; H01L 33/60; H01L 33/62; H01L 33/486;
(Continued)

(56) References Cited

U.S. PATENT DOCUMENTS 9,236,502 B2 * 1/2016 Tischler ............ H01L 27/14658
9,334,573 B2 * 5/2016 Higashiuchi .......... C23F 11/182
(Continued)

FOREIGN PATENT DOCUMENTS

JP 2010-135763 A 6/2010
JP 2013-149906 A 8/2013
(Continued)

*Primary Examiner* — Khiem D Nguyen
(74) *Attorney, Agent, or Firm* — Foley & Lardner LLP

(57) ABSTRACT

A method of manufacturing a light emitting device includes: mounting a light emitting element in a package in which a recess is defined, the light emitting element being mounted on a bottom surface defining the recess; forming a first reflecting layer by covering lateral surfaces defining the recess with a first resin containing a first reflecting material; forming a second reflecting layer covering the bottom surface defining the recess, wherein the step of forming the second reflecting layer comprises settling the second reflecting material in the second resin by a centrifugal force so as to form (i) a layer containing a second reflecting material on the bottom surface defining the recess, and (ii) a light-transmissive layer above the layer containing the second reflecting material; and disposing a phosphor-containing layer on the second reflecting layer and the light emitting element, the phosphor-containing layer comprising a third resin that contains a phosphor.

16 Claims, 14 Drawing Sheets

(51) Int. Cl.
*H01L 33/50* (2010.01)
*H01L 33/56* (2010.01)
*H01L 33/62* (2010.01)

(52) U.S. Cl.
CPC ........ *H01L 33/62* (2013.01); *H01L 2933/005* (2013.01); *H01L 2933/0041* (2013.01); *H01L 2933/0058* (2013.01); *H01L 2933/0066* (2013.01)

(58) Field of Classification Search
CPC ....... H01L 2933/005; H01L 2933/0041; H01L 25/165; H01L 25/167; H01L 33/20; H01L 33/54; H01L 25/0753
See application file for complete search history.

(56) References Cited

U.S. PATENT DOCUMENTS

| | | | |
|---|---|---|---|
| 9,397,276 B2* | 7/2016 | Ota | H01L 33/502 |
| 9,401,462 B2 | 7/2016 | Akazawa | |
| 9,419,187 B2* | 8/2016 | Akagawa | C09K 11/00 |
| 9,559,274 B2* | 1/2017 | Ota | C09K 11/025 |
| 9,708,531 B2* | 7/2017 | Shinohara | C09K 11/7792 |
| 10,032,965 B2* | 7/2018 | Kaide | C09K 11/7774 |
| 2008/0054279 A1 | 3/2008 | Hussell et al. | |
| 2010/0112734 A1* | 5/2010 | Koizumi | B29C 41/045 438/27 |
| 2013/0188381 A1 | 7/2013 | Kotani | |
| 2013/0193465 A1 | 8/2013 | Xu et al. | |
| 2015/0188004 A1 | 7/2015 | Ozeki et al. | |
| 2016/0300988 A1* | 10/2016 | Oh | H01L 33/56 |
| 2017/0154879 A1* | 6/2017 | Ozeki | H01L 33/483 |
| 2017/0179354 A1 | 6/2017 | Hayashi et al. | |
| 2018/0323357 A1 | 11/2018 | Hayashi et al. | |

FOREIGN PATENT DOCUMENTS

| | | |
|---|---|---|
| JP | 2014-093311 A | 5/2014 |
| JP | 2014-116560 A | 6/2014 |
| JP | 2016-029686 A | 3/2016 |
| JP | 2016-072412 A | 5/2016 |
| JP | 2017-098470 A | 6/2017 |
| JP | 2017-117867 A | 6/2017 |
| JP | 2018-082034 A | 5/2018 |

* cited by examiner

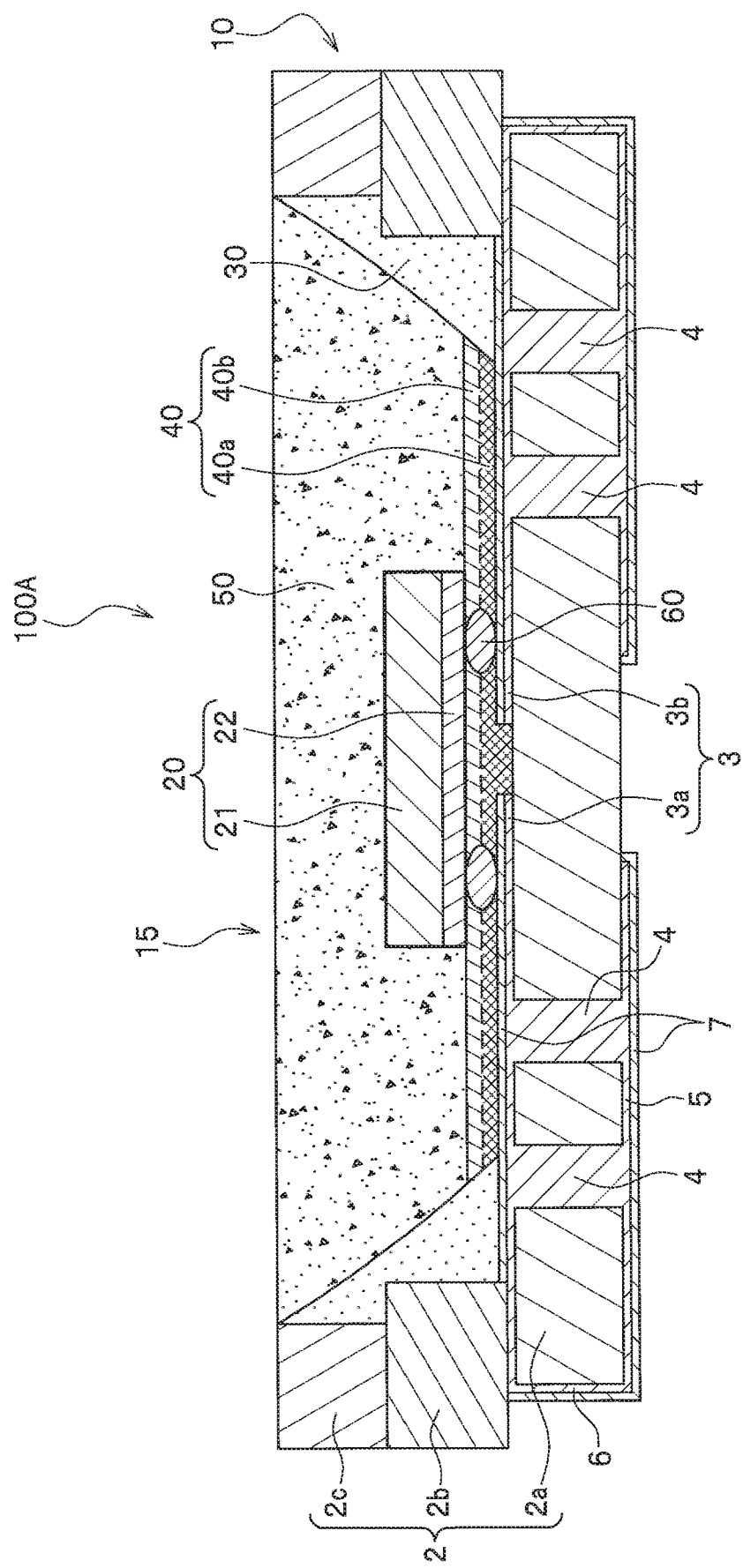

METHOD OF MANUFACTURING LIGHT EMITTING DEVICE THAT INCLUDES A FIRST REFLECTING LAYER AND A SECOND REFLECTING LAYER

CROSS-REFERENCE TO RELATED APPLICATION

This application claims priority to Japanese Patent Application No. 2018-124545 filed on Jun. 29, 2018, and Japanese Patent Application No. 2019-055625 filed on Mar. 22, 2019, the disclosures of which are hereby incorporated by reference in their entireties.

BACKGROUND

The present disclosure relates to a method of manufacturing light emitting device and a light emitting device.

A light emitting device in which a light emitting element is mounted on the bottom surface of a recessed package has been known. For example, Japanese Patent Application Publication No. 2016-72412 discloses a light emitting device in which a light emitting element is mounted on the bottom surface of a recess of a package, the bottom surface and the lateral surfaces of the recess are covered with a first resin layer containing a reflecting material, and the reflecting material is localized near the bottom surface and the lateral surfaces of the recess, and a method of manufacturing the same.

SUMMARY

The above patent publication discloses the method of disposing the layer containing a reflecting material near the bottom surface and the lateral surfaces of the recess by injecting a first resin containing the reflecting material into the recess, followed by applying a centrifugal force to the first resin. At this time, the placement of the reflecting material layer is accomplished by, for example, applying a centrifugal force about an axis of rotation with the bottom surface of the recess positioned outward of the axis, and then applying a centrifugal force about an axis of rotation with the lateral surfaces positioned outward of the axis.

However, the techniques described above require high precision adjustment in settling the reflecting material, and there is a possibility that the reflecting material layer is not continuously disposed from the bottom surface to the upper edges of the lateral surfaces of the recess. Although the light emitting device disclosed in the above patent publication can have high emission efficiency, there remains room for further improvement.

Certain embodiments of the present disclosure are intended to provide methods of manufacturing light emitting devices having high emission efficiency, and light emitting devices having high emission efficiency.

According to one embodiment, a method of manufacturing a light emitting device includes: mounting a light emitting element in a package on which a recess is defined, the light emitting element being mounted on a bottom surface in the recess; forming a first reflecting layer by covering lateral surfaces of the recess with a first resin containing a first reflecting material; forming a second reflecting layer by covering the bottom surface in the recess with a second resin containing a second reflecting material so as to be in contact with the first reflecting layer; and disposing a phosphor-containing layer, in which a third resin contains a phosphor, on the second reflecting layer and the light emitting element. In the step of forming a second reflecting layer, a layer containing the second reflecting material and a light-transmissive layer are formed on the bottom surface in the recess in that order by settling the second reflecting material in the second resin by a centrifugal force while forming the second reflecting layer such that the layer containing the second reflecting material does not face at least a portion of the lateral surfaces of the light emitting element.

According to another embodiment, a method of manufacturing a light emitting device includes: mounting a light emitting element in a package on which a recess is defined, the light emitting element being mounted on a bottom surface in the recess; forming a first reflecting layer by covering lateral surfaces of the recess with a first resin containing a first reflecting material; forming a second reflecting layer by covering the bottom surface in the recess with a second resin containing a second reflecting material so as to be in contact with the first reflecting layer; and disposing a phosphor-containing layer, in which a third resin contains a phosphor, on the second reflecting layer and the light emitting element. The step of forming a second reflecting layer includes: disposing the second resin on the bottom surface in the recess while being positioned between the lateral surfaces of the recess and the light emitting element by potting; changing a shape of the second resin so as to entirely cover the bottom surface in the recess exposed from the first reflecting layer by applying a centrifugal force to the package about an axis of rotation in which the bottom surface in the recess is positioned outside with respect to the axis of rotation; and curing the second resin while applying the centrifugal force.

According to another embodiment, a light emitting device includes: a package on which a recess is defined; a light emitting element mounted on a bottom surface in the recess; a first reflecting layer formed using a first resin containing a first reflecting member, the first reflecting layer covering lateral surfaces of the recess; a second reflecting layer formed using a second resin containing a second reflecting member, the second reflecting layer covering the bottom surface in the recess so as to be in contact with the first reflecting layer; and a phosphor-containing layer formed using a third resin containing a phosphor, the phosphor-containing layer disposed on the second reflecting layer and the light emitting element. The first reflecting layer has a configuration in which the first reflecting material is dispersed in the first resin. The second reflecting layer includes a layer containing the second reflecting material and a light-transmissive layer disposed on the bottom surface in the recess in that order such that the layer containing the second reflecting material does not face at least a portion of the lateral surfaces of the light emitting element.

A method of manufacturing a light emitting device according to embodiments of the present disclosure can manufacture a light emitting device having high emission efficiency.

A light emitting device according to embodiments of the present disclosure has high emission efficiency.

BRIEF DESCRIPTION OF THE DRAWINGS

FIG. 4 is a schematic cross-sectional view of the structure of a light emitting device according to another embodiment.

DETAILED DESCRIPTION

Certain embodiments of the present disclosure will be explained below with reference to the drawings. The embodiments described below exemplify a method of manufacturing a light emitting device, and a light emitting device, in order to give shape to the technical ideas of the present disclosure, and are not intended to limit the present invention. The sizes, materials, shapes, and relative positions of the elements shown merely exemplify these elements, and are not intended to limit the scope of the present invention unless otherwise specifically noted. The sizes, the positional relationship, and the like shown in each drawing might be exaggerated for clarity of explanation.

Figure 1A:
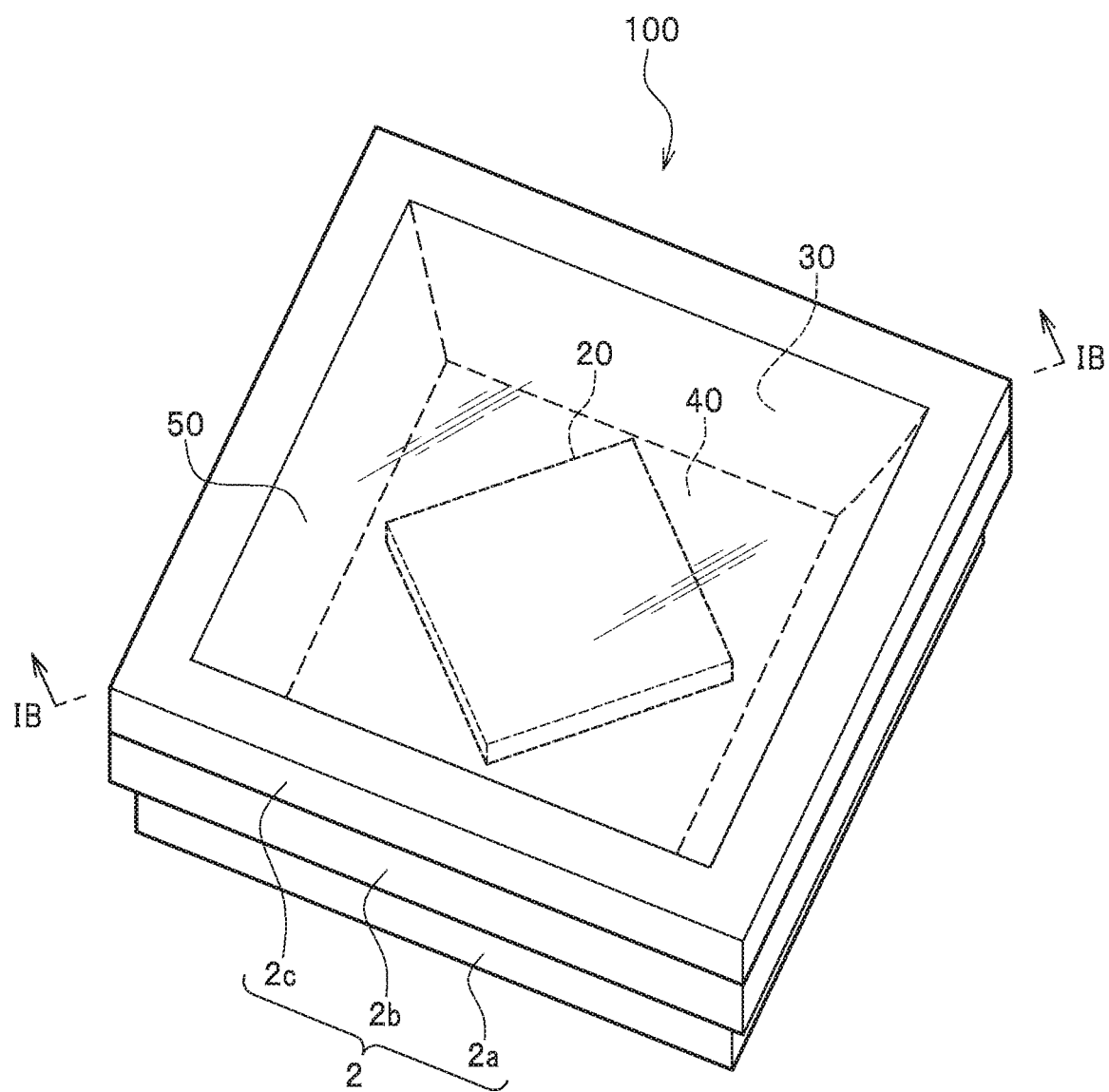
FIG. 1A is a schematic perspective view of the structure of a light emitting device according to certain embodiments.
Figure 1B:
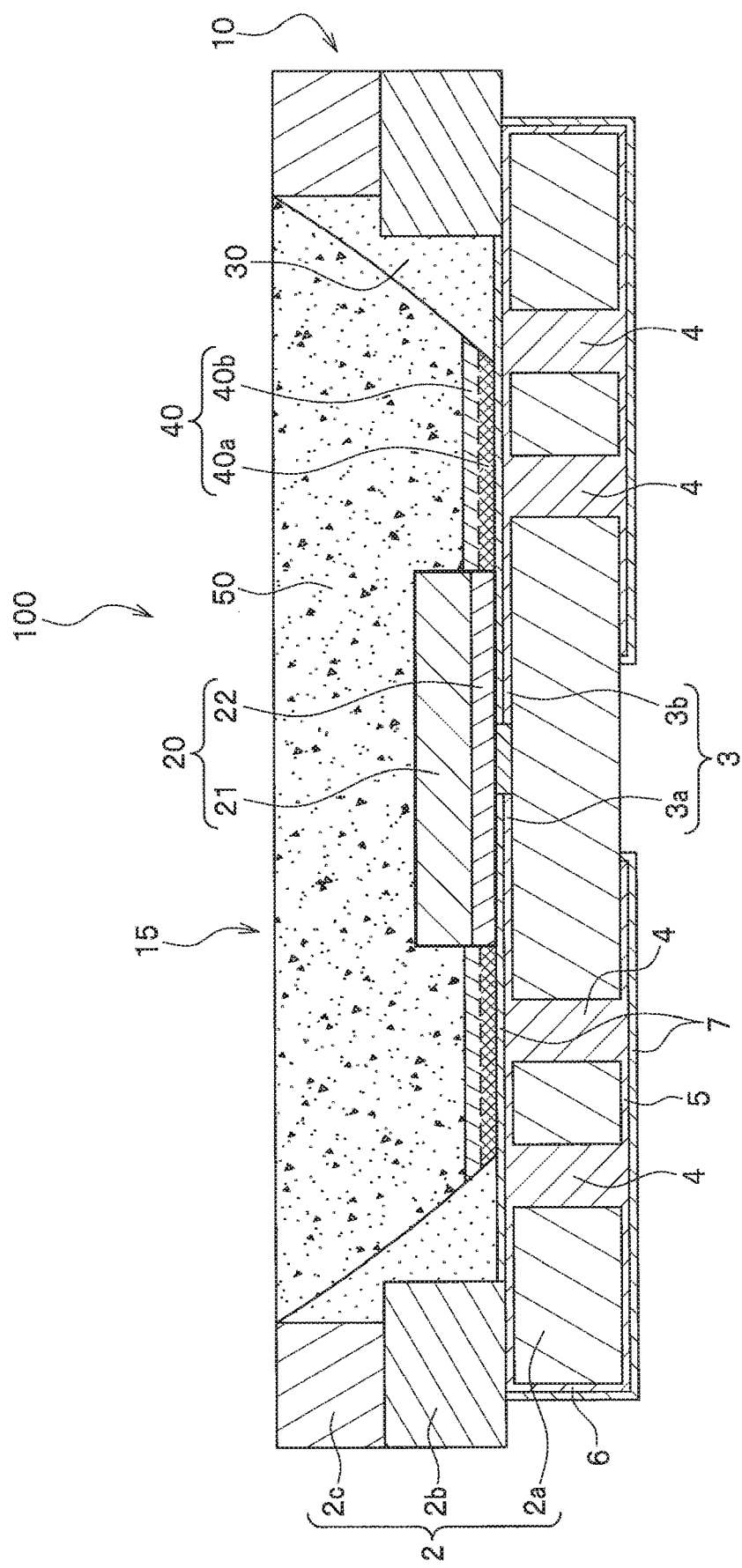
FIG. 1B is a schematic cross-sectional view taken along line IB-IB in FIG. 1A.
Figure 1C:
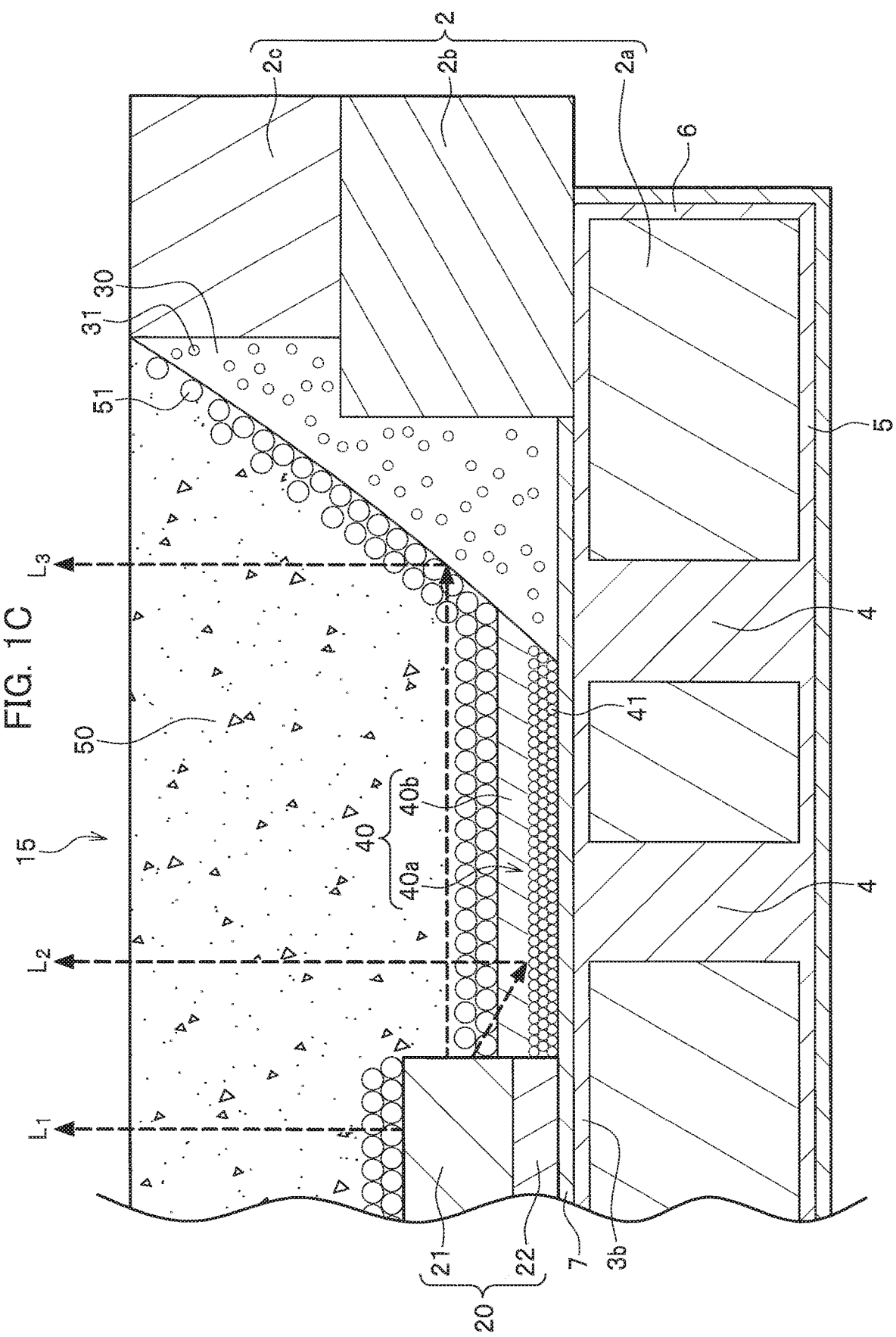
FIG. 1C is a schematic cross-sectional view of a portion of the structure of the light emitting device according to the embodiment.

FIG. 1A is a schematic perspective view of the structure of a light emitting device according to one embodiment. FIG. 1B is a schematic cross-sectional view taken along line IB-IB in FIG. 1A. FIG. 1C is a schematic cross-sectional view of a portion of the structure of the light emitting device according to the embodiment.

Light Emitting Device

The light emitting device 100 includes a package 10 in which a recess 15 is defined, a light emitting element 20 mounted on the bottom surface in the recess 15, a first reflecting layer 30 formed by covering the lateral surfaces in the recess 15, a second reflecting layer 40 formed by covering the bottom surface in the recess 15 while being in contact with the first reflecting layer 30, and a phosphor-containing layer 50 containing a phosphor 51 disposed on the second reflecting layer 40 and the light emitting element 20.

The package 10 includes an insulating substrate 2, first wiring portions 3 positioned on the upper surface of a base portion 2a of the insulating substrate 2, second wiring portions 5 positioned on the lower surface of the base portion 2a, third wiring portions 6 positioned on the lateral surfaces of the base portion 2a, and vias 4 for respectively electrically connecting the first wiring portions 3 and the second wiring portions 5. The package 10 is substantially rectangular in shape in a top view in which the recess 15 is formed. The opening of the recess 15 is substantially a rectangular shape in a top view.

The insulating substrate 2 includes the base portion 2a above which the light emitting element 20 is mounted, a first wall 2b formed above the perimeter of the upper surface of the base portion 2a, and a second wall 2c stacked on the first wall 2b. The insulating substrate 2 has a recessed shape having an opening in the center inwards of the first wall 2b and the second wall 2c.

The base portion 2a, the first wall 2b, and the second wall 2c are formed such that they are stepped inwards thereof. The outer lateral surfaces of the first wall 2b and the outer lateral surfaces of the second wall 2c are coplanar. The inner lateral surfaces of the first wall 2b are formed inwards of the inner lateral surfaces of the second wall 2c. The first wall 2b positioned inwards of the second wall 2c can allow a first reflecting layer 30 to have an inclined surface described later. The lateral surfaces in the recess 15 may be inclined surfaces whose widths in a lateral direction increase from the bottom surface to the opening, instead of the stepped shape.

Example materials of the insulating substrate 2 include: a thermoplastic resin, such as polyphthalamide (PPA), polyphenylene sulfide (PPS), liquid crystal polymer, and the like; or a thermosetting resin, such as an epoxy resin, silicone resin, modified epoxy resin, urethane resin, phenol resin, and the like. It is preferable to use a glass epoxy resin, ceramic, glass, or the like for the insulating substrate 2. In the case of using a ceramic for the insulating substrate 2, it is particularly preferable to use alumina, aluminum nitride, mullite, silicon carbide, silicon nitride, or the like.

The first wiring portions 3 are provided on the upper surface of the base portion 2a and to be electrically connected to the light emitting element 20. The first wiring portions 3 include a first lead 3a and a second lead 3b as a pair of positive and negative electrodes, and the light emitting element 20 is flip-chip mounted on the first lead 3a and the second lead 3b.

The second wiring portions 5 that are disposed on the lower surface of the base portion 2a to serve as the external electrodes of the light emitting device 100 are be electrically connected to an external power source.

The vias 4 are provided in through holes passing through the base portion 2a, and the third wiring portions 6 are provided on the lateral surfaces of the base portion 2a, to electrically connect the first wiring portions 3 and the second wiring portions 5. Either the vias 4 or the third wiring portions 6 may be omitted as long as the first wiring portions 3 and the second wiring portions are electrically connected.

For the first wiring portions 3, the second wiring portions 5, and the third wiring portions 6, for example, Fe, Cu, Ni, Al, Ag, Au, or an alloy containing one of these can be used.

For the first wiring portions 3, the second wiring portions 5, and the third wiring portions 6 may have a plated layer 7 formed on their surfaces. For the plated layer 7, for example, Au, Ag, Cu, Pt, or an alloy containing one of these can be used. Using these materials for the plated layer 7 can further increase the effectiveness in reflecting the light from the light emitting element 20.

The light emitting element 20 includes a light-transmissive substrate 21 and a semiconductor layer 22 formed on the substrate 21. The substrate 12 can be formed using a conductive material or an insulating material. Shape, size, and the like can be appropriately selected for the light emitting element 20. As to the emission color of the light emitting element 20, appropriately selected wavelength can be selected in accordance with the application. For example, a GaN-based or InGaN-based element can be used as a blue light emitting element 20 (i.e., wavelength of 430 to 490 nm). For an InGaN-based element, $In_XAl_YGa_{1-X-Y}N$ ($0 \leq X \leq 1$, $0 \leq Y \leq 1$, $X+Y \leq 1$) or the like can be used.

The thickness of the light emitting element 20 (e.g., the height from the lower surface of the semiconductor layer 22 to the upper surface of the substrate 21) is in the range of, for example, from 100 μm to 300 μm.

The first reflecting layer 30 and the second reflecting layer 40 reflect the emitted light from the light emitting element 20.

The interior surfaces, more preferably the entire interior surfaces, of the recess 15 are preferably covered with the first reflecting layer 30 and the second reflecting layer 40 such that the light emitted from the light emitting element 20 is less likely to transmit through or be absorbed by the bottom surface and lateral surfaces in the recess 15. Moreover, the surfaces of the light emitting element 20 are preferably exposed from the first reflecting layer 30 and the second reflecting layer 40 such that the upper surface and the lateral surfaces of the light emitting element 20 are not covered with the first reflecting layer 30 or the second reflecting layer 40 such that the extraction of the light emitted from the light emitting element 20 is not interfered.

The first reflecting layer 30 is formed to cover the lateral surfaces in the recess 15 of the package 10 using a first resin containing a first reflecting material 31. The first reflecting layer 30 covers the outer edges of the bottom surface in the recess 15 spaced apart from the lateral surfaces of the light emitting element 20. The first reflecting layer 30 continuously covers from the outer edges of the bottom surface in the recess 15 to the lateral surfaces in the recess 15. It is more preferable for the first reflecting layer 30 to cover substantially the entire lateral surfaces in the recess 15, but is preferable to cover the lateral surfaces in the recess 15 such that the upper edge of the first reflecting layer 30 is higher than the upper surface of the light emitting element 20 in a cross-sectional view of the light emitting device 100.

The first reflecting layer 30 has a structure in which the first reflecting material 31 is dispersed in the first resin. In the present disclosure, "the first reflecting material 31 dispersed in the first resin" simply means that the reflecting material is dispersed enough to function as a reflecting layer, for example, a dispersed state achievable by applying a resin containing a reflecting material by known methods in the art. The first reflecting layer 30 may contain the first reflecting material 31 localized in one portion as long as it can function as a reflecting layer.

The concentration of the first reflecting material 31 contained in the first reflecting layer 30 is in the range of, for example, from 10 mass percent to 50 mass percent.

Covering the lateral surfaces in the recess 15 with the first reflecting layer 30 can prevent or discourage the lateral surfaces in the recess 15 from transmitting or absorbing light.

The second reflecting layer 40 is formed to cover the bottom surface in the recess 15 of the package 10 using a second resin containing a second reflecting material 41 while being in contact with the first reflecting layer 30. The second reflecting layer 40 covers a portion of the first reflecting layer 30 in addition to covering the upper surface of the base portion 2a of the insulating substrate 2 and the first wiring portions 3 at the bottom surface in the recess 15. The second reflecting layer 40 covers the bottom surface in the recess 15 with a substantially uniform thickness.

Covering the bottom surface in the recess 15 with the second reflecting layer 40 can prevent or discourage the plated layer 7 and the base portion 2a from transmitting or absorbing light.

The second reflecting layer 40 is disposed such that at lease some portions of the lateral surfaces of the light emitting element 20 are exposed from the second reflecting layer 40. In the present disclosure, only the portions of the lateral surfaces of the light emitting element 20 located on the semiconductor layer 22 side, in other words, on the bottom surface side in the recess 15, are covered by the second reflecting layer 40, and the other portions of the lateral surfaces, which are exposed from the second reflecting layer 40, are covered by the phosphor-containing layer 50.

The lateral surfaces of the light emitting element 20 here refer to both the lateral surfaces of the substrate 21 and the lateral surfaces of the semiconductor layer 22.

In a cross-sectional view, the second reflecting material 41 in the second reflecting layer 40 is localized on the bottom surface side.

The second reflecting layer 40 preferably includes a layer 40a containing the second reflecting material 41 and a light-transmissive layer 40b, successively from the bottom surface in the recess 15. The reflective-material-containing layer 40a is created by settling the second reflecting material 41, which is the portion where the second reflecting material 41 is disposed in high concentration in the direction of depth of the second reflecting layer 40. The light-transmissive layer 40b primarily containing a resin is an upper part of the second reflecting layer 40 formed as a result of settling the second reflecting material 41. That is, there is no clear interface created between the reflective-material-containing layer 40a and the light-transmissive layer 40b.

The second reflecting layer 40 is disposed such that at least some portions of the lateral surfaces of the light emitting element 20 do not oppose the reflecting-materialcontaining layer 40a. The second reflecting layer 40 is preferably disposed such that substantially the entire lateral surfaces of the light emitting element 20 do not face the reflecting-material-containing layer 40a. That is, it is preferable that substantially the entire lateral surfaces of the light emitting element 20 are not covered with the layer 40a. In the present embodiment, only some areas of the lateral surfaces of the light emitting element 20 on the mounting surface side are covered with the reflecting-material-containing layer 40a, while the remaining lateral surface areas exposed from the reflecting-material-containing layer 40a are covered with the light-transmissive layer 40b or the phosphor-containing layer 50. In the present embodiment, with regard to the lateral faces of the light emitting element 20, the second reflecting layer 40 is disposed such that the reflecting-material-containing layer 40a does not cover the entire lateral surfaces of the semiconductor layer 22.

Disposing the second reflecting layer such that at least some portions of the lateral areas of the semiconductor layer 22 of the light emitting 20 does not face the reflecting-material-containing layer 40a can increase the efficiency of extracting light from the lateral surfaces of the light emitting element 20, thereby improving the color distribution of light emitted from in lateral directions relative to the light emitting element 20.

The second reflecting layer 40 can simply be disposed such that at least some portions of the lateral surfaces of the light emitting element 20 do not face the reflecting-material-containing layer 40a. However, in order to further improve the effects described above, it is preferable to reduce the lateral surface areas of the light emitting element 20 that oppose the reflecting-material-containing layer 40a to the extent possible. It is more preferable to have no lateral surface areas of the light emitting element 20 that oppose the reflecting-material-containing layer 40a (see FIGS. 4 and 5).

Disposing the second reflecting layer 40 such that at least some portions of the lateral surfaces of the light emitting element 20 do not face the reflecting-material-containing layer 40a means that the second reflecting layer 40 is disposed such that at least one portion of each of all lateral surfaces of the light emitting element 20 does not face the reflecting-material-containing layer 40a.

The thickness of the second reflecting layer 40 preferably is in the range of, for example, from 10 μm to 200 μm. Having a thickness of 10 μm or larger can facilitate the formation of the second reflecting layer 40. A thickness of 200 μm at most can further improve the effect achieved by disposing the reflecting-material-containing layer 40a so as to not face at least some portions of the lateral surfaces of the light emitting element 20 described above.

By setting the thickness of the second reflecting layer 40 in the range of, for example, from 10 μm to 200 μm, the second reflecting layer 40 can be disposed while reducing surface tension-induced creeping up of the resin onto the lateral surfaces of the light emitting element 20 during the step of settling the second reflecting material 41 by a centrifugal force. Setting the thickness of the second reflecting layer 40 smaller than the thickness of the bonding members, such as bumps, between the light emitting element 20 and the insulating substrate 2 can further improve the effect achieved by disposing the reflecting-material-containing layer 40a so as to not face the lateral surfaces of the light emitting element 20 discussed earlier.

The thickness of the reflecting-material-containing layer 40a in the second reflecting layer 40 preferably is in the range of from 10% to 100%, more preferably from 25% to 50%, of the thickness of the second reflecting layer 40.

The concentration of the second reflecting material 41 in the reflecting-material-containing layer 40a can be increased as the thickness percentage of the reflecting-material-containing layer 40a in the second reflecting layer 40 decreases. The concentration of the second reflecting material 41 in the reflecting-material-containing layer 40a is preferably higher than the concentration of the first reflecting material 31 in the first reflecting layer 30. The second reflecting layer 40 is preferably thinner in order to expose the lateral surfaces of the light emitting element 20. For this purpose, increasing the concentration of the second reflecting material 41 in the reflecting-material-containing layer 40a can improve the light extraction efficiency achieved by exposing the lateral surfaces of the light emitting element 20, as well as reducing the transmission and absorption of light by the bottom surface in the recess 15. The concentration of the second reflecting material 41 in the reflecting-material-containing layer 40a can be set in the range of, for example, from 50 mass percent to 70 mass present.

In the case in which portions of the lateral surfaces of the light emitting element 20 face the reflecting-material-containing layer 40a, the thickness of the reflecting-material-containing layer 40a is preferably ¼ at most, more preferably ⅙ at most, even more preferably ⅛ at most of the height of the lateral surfaces of the light emitting element 20.

Examples of resin materials used for the first resin and the second resin include thermosetting resins, such as an epoxy resin, modified epoxy resin, silicone resin, modified silicone resin, and the like.

The first resin and the second resin may be formed using the same resin material, or different resin materials.

The viscosity of the second resin preferably is in the range of from 0.3 Pa·s to 15 Pa-s at room temperature (20±5° C.). A viscosity of 0.3 Pa·s or higher facilitates the provision of the second resin on the bottom surface in the recess 15 by potting. Using a second resin having a viscosity of 15 Pa·s at most facilitates change of its shape and settlement of the second reflecting material 41 by a centrifugal force. The viscosity of the second resin for achieving the above described effects more preferably ranges from 0.5 Pa·s to 6 Pa·s.

The viscosity of the second resin in the present embodiment is the viscosity in the state of containing a second reflecting material 41, and is the viscosity before settling the second reflecting material 41 in the second resin by a centrifugal force as described later.

Examples of reflecting materials employed for the first reflecting material 31 and the second reflecting material 41 include titanium oxide, silica, silicon oxide, aluminum oxide, zirconium oxide, magnesium oxide, potassium titanate, zinc oxide, boron nitride, and the like. Among such examples, titanium oxide, which has a relatively high refractive index is preferably used from the perspective of light reflection.

The first reflecting material 31 and the second reflecting material 41 may be formed using the same type or different types of materials.

For the second reflecting material 41, one having a larger specific gravity than that of the resin material employed for the second resin is preferably used. The difference in specific gravity between the second reflecting material 41 and the resin material facilitates the settling of the second reflecting material 41 towards the bottom surface by a centrifugal force. Moreover, employing one having a large particle size for the second reflecting material 41 can more quickly settle the second reflecting material 41 towards the bottom surface.

The use of a centrifugal force allows the second reflecting material 41 to be disposed with high density, which reduces the space between particles thereby reducing leakage or transmission of light and increasing the reflectance of the second reflecting layer 40.

The particle size of the second reflecting material 41 preferably is in the range of from 0.1 µm to 1.0 µm. Having a particle size of 0.1 µm or larger facilitates the settling of the second reflecting material 41 by a centrifugal force. Having a particle size of 1.0 µm at most facilitates the reflection of visible light by the second reflecting material 41. More preferably, the particle size of the second reflecting material 41, is in the range of from 0.4 µm to 0.6 µm from the perspective above description.

The phosphor-containing layer 50 is formed using a third resin that contains a phosphor 51. The phosphor-containing layer 50 is disposed on the second reflecting layer 40 and the light emitting element 20 so as to be in contact with the first reflecting layer 30.

Examples of resin materials employed for the third resin include thermosetting resins, such as an epoxy resin, modified epoxy resin, silicone resin, modified silicone resin, and the like. The resin material used as the third resin may be formed using the same material as those of the first resin and the second resin, or a different material. Alternatively, a highly heat resistant resin can be used for the first resin and the second resin while employing a hard resin for the third resin.

Silicone resins are generally more resistant to light in the range of from around 450 nm to around 500 nm than epoxy resins. Epoxy resins are harder than silicone resins. For such reasons, a silicone resin may be used for the first resin and the second resin, and an epoxy resin for the third resin.

The phosphor 51 is disposed on the upper surface of the light emitting element 20, the inner lateral surface of the first reflecting layer 30, and the upper surface of the second reflecting layer 40. By disposing the phosphor 51 on the upper surface of the light emitting element 20, the wavelength of the light from the light emitting element 20 can be efficiently converted before being externally output. By disposing the phosphor 51 on the inner lateral surface of the first reflecting layer 30, the wavelength of the light reflected by the first reflecting layer 30 can be efficiently converted before being externally output. By disposing the phosphor 51 on the upper surface of the second reflecting layer 40, the wavelength of the light reflected by the second reflecting layer 40 can be efficiently converted before being externally output.

For the phosphor 51, one having a larger specific gravity than that of the resin material employed for the third resin is preferably used. This allows the phosphor 51 to naturally settle in the third resin towards the bottom surface in the recess 51. The phosphor 51 may be artificially settled in the third resin by applying a centrifugal force.

The particle size of the phosphor 51 is in the range of, for example, from 3 µm to 50 µm.

The phosphor 51 may be dispersed in the third resin. Dispersing the phosphor 51 in the third resin can reduce variability in the distribution of the light exiting from the light emitting device 100.

For the phosphor 51, materials known in the art can be used. Specific examples include: yellow-emitting phosphors, such as YAG ($Y_3Al_5O_{12}$:Ce), silicate; red-emitting phosphors, such as CASN (CaAlSiN$_3$:Eu), KSF ($K_2SiF_6$: Mn); or green-emitting phosphors, such as chlorosilicate, $BaSiO_4$:$Eu^{2+}$.

Operation of Light Emitting Device

When the light emitting device 100 is operated, an electric current is supplied to the light emitting element 20 from an external power source through the first wiring portions 3, the vias 4, the second wiring portions 5, and the third wiring portions 6, resulting in light emission of the light emitting element 20. Among portions of the light from the emitting element 20, the light $L_1$ advancing upwards is extracted from the upper portion of the light emitting device 100. The light $L_2$ advancing downwards is reflected by the reflecting-material-containing layer 40a and output towards the opening of the recess 15 to be extracted from the light emitting device 100. The laterally advancing light $L_3$ is reflected by the first reflecting layer 30 and output towards the opening of the recess 15 to be extracted from the light emitting device 100. Accordingly, the light emitted from the light emitting element 20 is less likely to leak from the bottom surface and the lateral surfaces in the recess 15, thereby improving the light extraction efficiency. This can also attenuate color non-uniformity.

Method of Manufacturing a Light Emitting Device 100

Next, an example of the method of manufacturing a light emitting device according to one embodiment will be explained.

Figure 2:
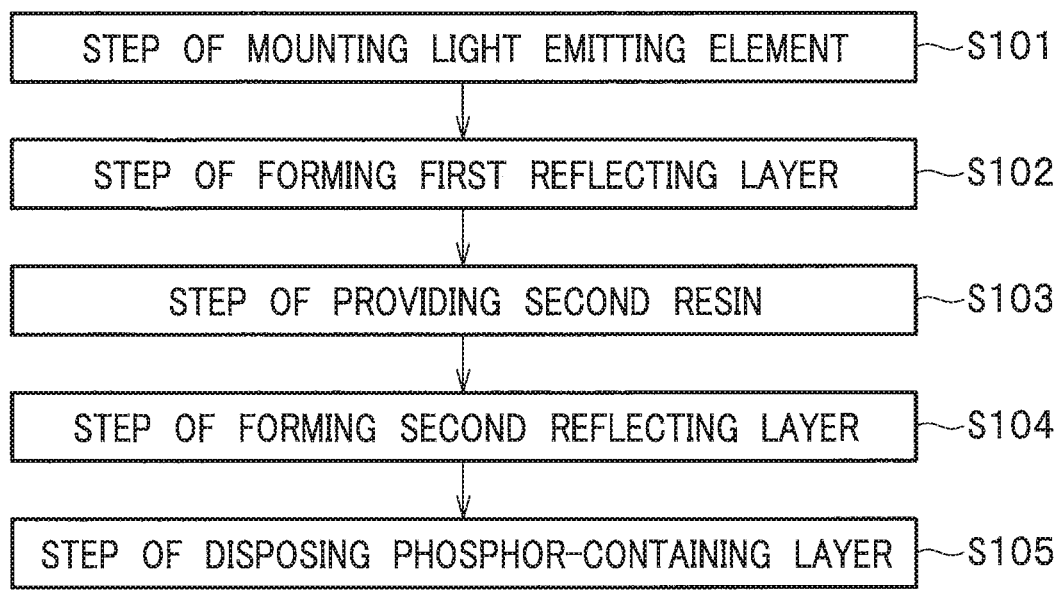
FIG. 2 is a flowchart of a method of manufacturing the light emitting device according to certain embodiments.
Figure 3A:
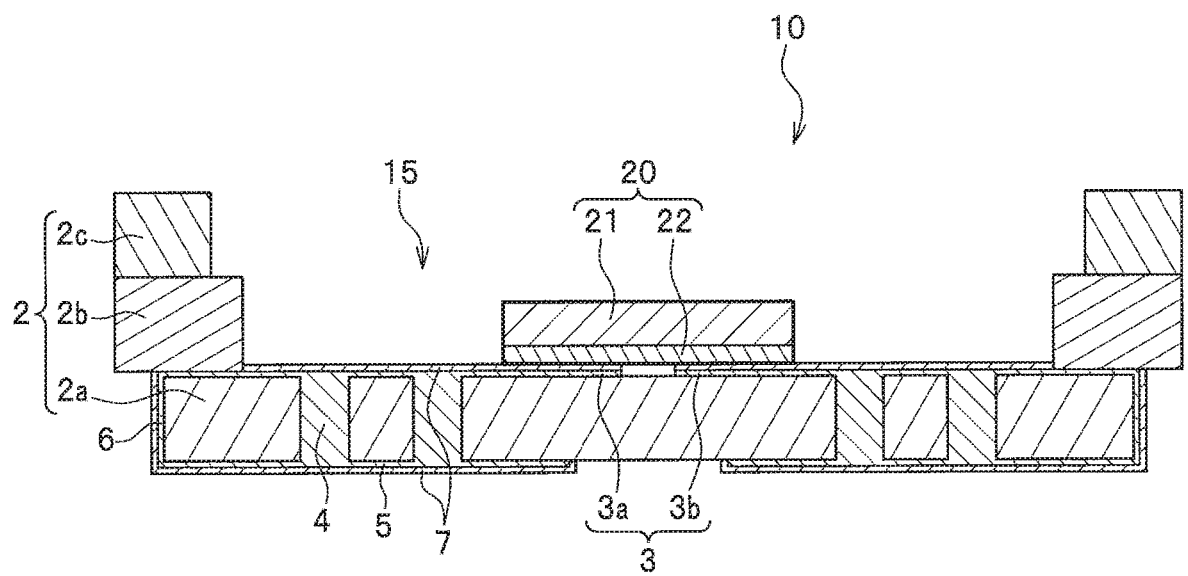
FIG. 3A is a schematic cross-sectional illustration of a step of mounting a light emitting element in the method of manufacturing the light emitting device according to the embodiment.
Figure 3B:
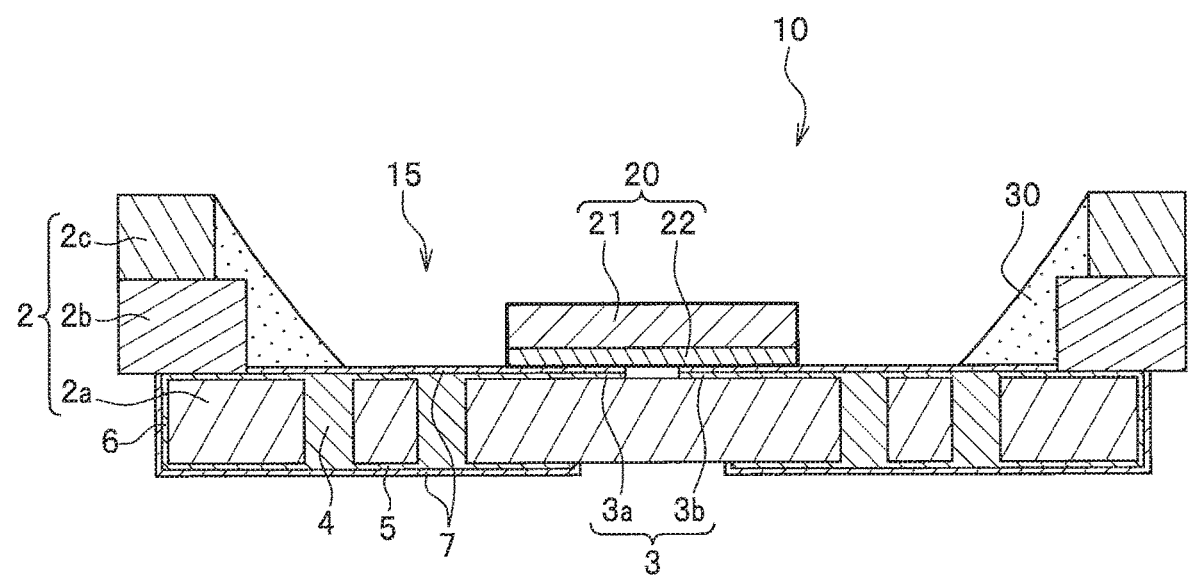
FIG. 3B is a schematic cross-sectional illustration of a step of forming a first reflecting layer in the method of manufacturing the light emitting device according to the embodiment.
Figure 3C:
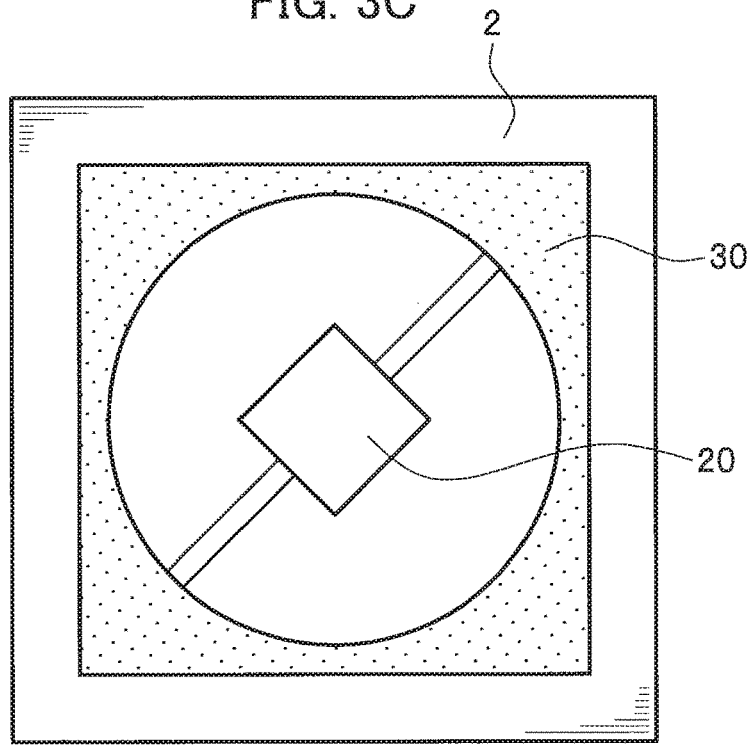
FIG. 3C is a schematic top-view illustration of the step of forming the first reflecting layer in the method of manufacturing the light emitting device according to the embodiment.
Figure 3D:
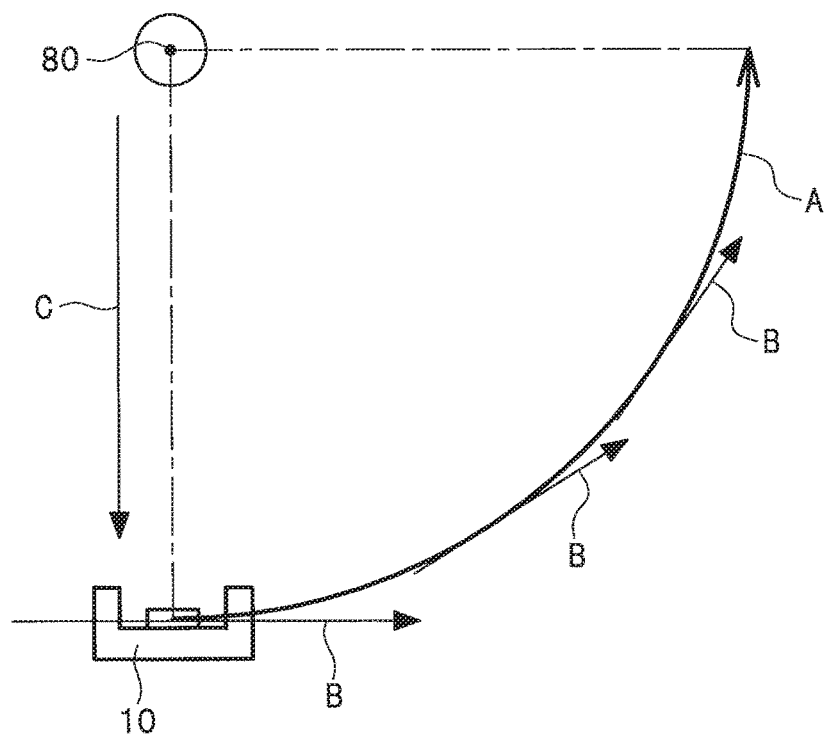
FIG. 3D is a schematic cross-sectional illustration of the step of forming a second reflecting layer in the method for manufacturing the light emitting device according to the embodiment, which schematically shows the application of a centrifugal force to settle the second reflecting material in the second resin that covers the bottom surface in the recess of the package.
Figure 3E:
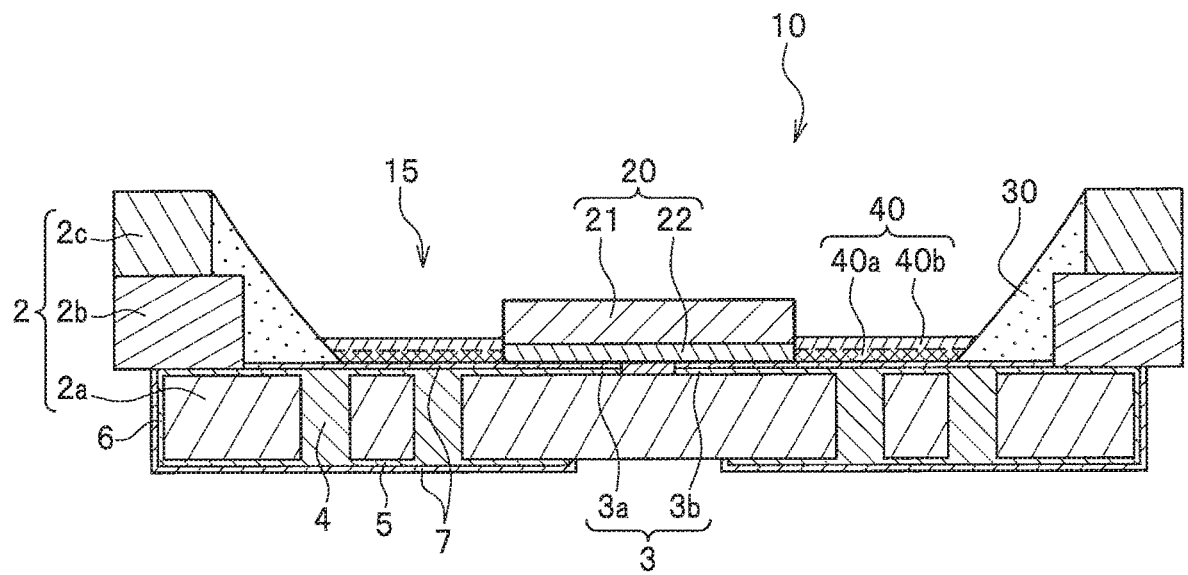
FIG. 3E is a schematic cross-sectional illustration of a step of forming a second reflecting layer in the method of manufacturing the light emitting device according to the embodiment, which shows the state after settling the second reflecting material by a centrifugal force.
Figure 3F:
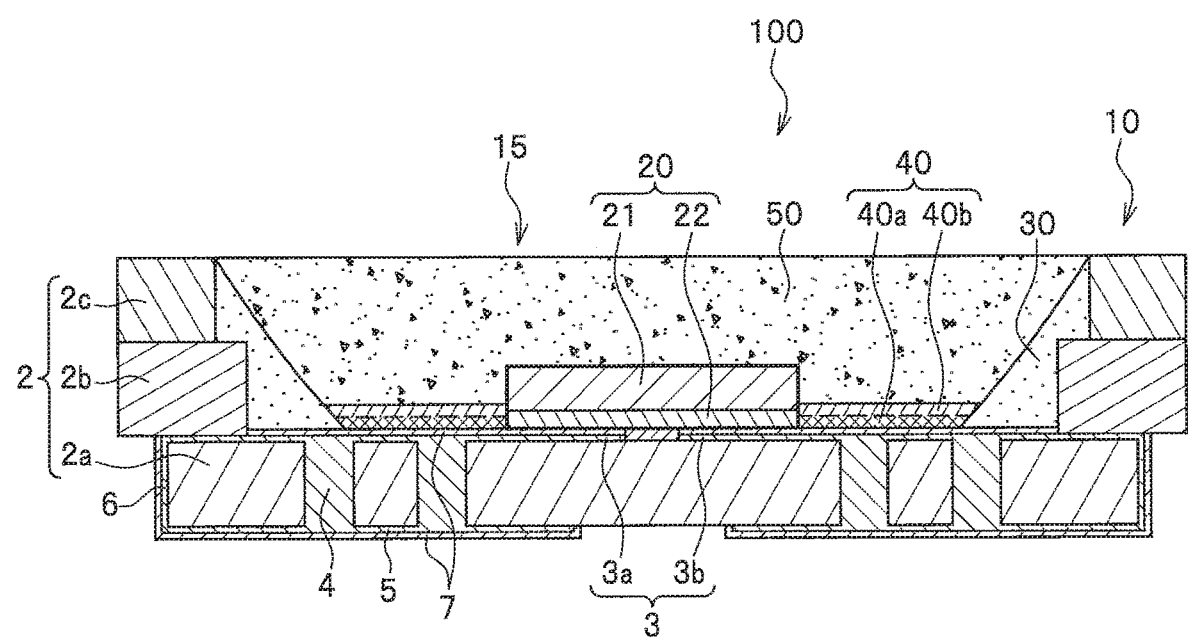
FIG. 3F is a schematic cross-sectional illustration of a step of forming the phosphor-containing layer in the method of manufacturing a light emitting device according to the embodiment.

FIG. 2 is a flowchart of the method of manufacturing the light emitting device according to the embodiment. FIG. 3A is a cross-sectional illustration of a step of mounting a light emitting element in the method of manufacturing the light emitting device according to the embodiment. FIG. 3B is a cross-sectional illustration of a step of forming a first reflecting layer in the method of manufacturing the light emitting device according to the embodiment. FIG. 3C is schematic top-view illustration of the step of forming the first reflecting layer in the method of manufacturing the light emitting device according to the embodiment. FIG. 3D is a schematic diagram showing a step of forming a second reflecting layer in the method of manufacturing the light emitting device according to the embodiment, which schematically shows the application of a centrifugal force to settle the second reflecting material in a second resin that covers the bottom surface in the recess of the package. FIG. 3E is a cross-sectional illustration of a step of forming the second reflecting layer in the method of manufacturing the light emitting device according to the embodiment, which shows the state after settling the second reflecting material by a centrifugal force. FIG. 3F is a cross-sectional illustration of a step of disposing a phosphor-containing layer in the method of manufacturing the light emitting device according to the embodiment.

The method of manufacturing a light emitting device 100 includes the step S101 of mounting the light emitting element, the step S102 of forming the first reflecting layer, step S103 of providing the second resin, the step S104 of forming the second reflecting layer, and the step S105 of disposing the phosphor-containing layer. The materials and the layout of the members are as explained with reference to the light emitting device 100 above, for which the explanation will be omitted as appropriate.

Step of Mounting Light Emitting Element

In the step S101, the light emitting element 20 is mounted on the bottom surface in the recess 15 formed in the package 10.

The light emitting element 20 is flip-chip mounted substantially in the center of the bottom surface in the recess with the surface having electrodes serving as the mounting surface. The light emitting element 20 is mounted using a conductive adhesive. For the conductive adhesive, for example, eutectic solder, conductive paste, bumps, and the like can be used. The light emitting element 20 may be mounted with facing up, and in this case, a non-conductive adhesive may be used.

Step of Forming First Reflecting Layer

In the step S102, the first reflecting layer 30 is formed to cover the lateral surfaces in the recess 15 with a first resin containing a first reflecting material 31.

The first resin that covers the lateral surfaces in the recess 15 is disposed by, for example, potting. The first resin can be disposed in the recess 15 by discharging an uncured resin material from the nozzle of a resin discharging device filled with a first resin into the vicinity of the outer edges of the bottom surface in the recess 15 (preferably along the borders with the lateral surfaces). The uncured first resin wets and spreads onto the lateral surfaces in the recess 15 covering the lateral surfaces in the recess 15. The first resin also flows to the bottom surface in the recess 15 at this time, thus the first resin covers portions of the outer peripheral regions of the bottom surface in the recess 15. In the present embodiment, the viscosity and the forming positions of the first resin are preferably adjusted such that the first resin is positioned away from the lateral surfaces of the light emitting element 20 and creeps up the lateral surfaces in the recess 15. In the case of forming the first reflecting layer 30 by potting, the viscosity of the first resin is adjusted to, for example, 1 Pa·s to 50 Pa·s at room temperature (20±5° C.).

In step S102, the interior surfaces of the recess 15 can be pre-wetted with an organic solvent. By pre-wetting the interior surfaces of the recess 15 with an organic solvent can facilitate the creeping of the first resin onto the lateral surfaces of the recess 15. The creeping of the resin onto the lateral surfaces of the recess 15 can also be facilitated by using a material having high wettability for the lateral surfaces of the recess 15, roughening the surfaces of the lateral surfaces, or other manner.

The first reflecting material 31 is mixed into the first resin before being cured, and the content of the first reflecting material 31 in the first resin is preferably set to 10 mass percent to 50 mass percent.

The first resin can wet and spread onto the lateral surfaces of the recess 15 by potting the first resin in the vicinity of the outer edges of the bottom surface in the recess 15. At this time, the first reflecting layer 30 is in the state where the first reflecting material 31 is dispersed in the first resin.

Subsequently, the first reflecting layer 30 is formed by curing the first resin at a temperature, for example, of from 120° C. to 200° C. The first resin is preferably cured in the state where the package is left standing after allowing the first resin to wet and spread over the lateral surfaces of the recess 15.

In the step 102, the first reflecting member 30 is formed so as to have an inner periphery with a circular shape in a top view.

Step of Providing Second Resin

The step S103 of providing the second resin is the step of mixing the base resin of a two-component curable resin material and a second reflecting material 41, followed by mixing a curing agent a certain time period.

Using a second resin provided in this manner can improve the affinity between the second reflecting material 41 and the resin material, facilitating the settling of the second reflecting material 41 with a centrifugal force. The temperature before mixing a curing agent is around room temperature.

Examples of two-component curable resin materials include silicone resins, modified silicone resins, epoxy resins, modified epoxy resins, and the like.

The time allowed to elapse after mixing the base resin of the two-component curable resin materials and the second reflecting material 41 is preferably at least 2 hours from the perspective of facilitating the settling of the second reflecting material 41. It is preferably 8 hours at most, moreover, from the perspective of reducing the manufacturing time. After mixing the curing agent, the subsequent step is carried out before the second resin is cured.

Step of Forming Second Reflecting Layer

In the step S104, the second reflecting layer 40 is formed by covering the bottom surface in the recess 15 with a second resin that contains a second reflecting material 41 so as to be in contact with the first reflecting layer 30.

The second resin is disposed, for example, by potting the uncured second resin on the bottom surface in the recess 15 similar to the first resin. At this time, the second resin is disposed on the bottom surface in the recess 15 while being between the lateral surfaces in the recess 15 and the light emitting element 20. Preferably, the second resin is disposed in contact with the first reflecting layer 30. This can reduce the flow of the second resin towards the light emitting element 20 to thereby more effectively discourage or prevent the second resin from creeping onto the lateral surfaces of the light emitting element 20 prior to being rotated with a centrifugal force. The creeping up of the second resin onto the lateral surfaces of the light emitting element 20 can be eliminated by changing the shape of the second resin by centrifugal rotation, but the second resin might remain on the lateral surfaces of the light emitting element 20 depending on the viscosity of the second resin and the rotational speed. For this reason, it is preferable to avoid that the second resin covers the lateral surfaces of the light emitting element 20 before being rotated by a centrifugal force.

Subsequently, the package 10 is rotated in the direction that applies a centrifugal force to the bottom surface in the recess 15. The second resin moves to the surface close to the bottom surface in the recess 15 by this centrifugal force to thereby cover the bottom surface in the recess 15. At this time, even if the second resin covers portions of the lateral surfaces of the light emitting element 20, applying the centrifugal force can discourage or prevent the wetting and spreading of the resin in the height direction of the lateral surfaces of the light emitting element 20. Furthermore, this centrifugal force can be used for artificially settling the second reflecting material 41 in the second resin towards the bottom surface in the recess 15, to thereby form a light-transmissive layer 40b and a layer 40a that contains the second reflecting material 41.

The package 10 is preferably rotated by applying a centrifugal force to the package 10 about an axis of rotation 80 in which the bottom surface in the recess 15 is positioned outside with respect to the axis. Specifically, the package 10 is moved in a direction A and revolves about the axis of rotation 80 such that the axis of rotation 80 is positioned close to the upper surface side of the package 10. A direction B in FIG. 3C is a direction parallel to the bottom surface in the recess 15. The axis of rotation 80 is parallel to the bottom surface in the recess 15 located on a perpendicular line that passes through substantially the center of the bottom surface in the recess 15, and is located on the opening side in the recess 15 of the package 10. This allows the centrifugal force to act in the direction toward the bottom surface in the recess 15, to thereby reduce the spreading of the second resin in the height direction of the package 10 and artificially settle the second reflecting material 41 towards the bottom surface in the recess 15 (in the direction C in FIG. 3D). By curing the second resin in this condition, the layer 40a containing the second reflecting material 41 and the light-transmissive layer 40b are formed on the bottom surface in the recess 15 in that order.

For the second reflecting layer 40 can be formed by suitably adjusting the discharging amount and the content of the second reflecting material 41 in the second resin. Then the second reflecting layer 40 is formed such that the reflecting-material-containing layer 40a does not face at least some portions of the lateral surfaces of the light emitting element 20.

The rotational speed or number of revolutions when applying a centrifugal force to the package 10 would depend on the content and particle size of the reflecting material 41, but the number of rotations and the turning radius of the rotation can simply be adjusted such that a centrifugal force of, for example, 200×g will be applied.

In the manufacturing process, when rotating multiple packages 10 configuring as a substrate block before being divided into individual substrates, the larger the area of the substrate block, (more precisely, the longer the length of the substrate in the direction of rotation A), the packages 10 positioned at a greater distance from the center of the substrate block will be deviated from the axis of rotation 80. In the substrate block, for example, when the deviations from the circumference of revolution in the direction B increase, the second resin surfaces become inclined to the bottom surfaces in the recesses 15, possibly resulting in variability in the surface condition of the second resins in the packages on the substrate block. These deviations can be reduced by increasing the turning radius. Specifically, using a turning radius at least 70 times the length of the substrate block arranged along the direction of rotation can reduce the deviations.

In the case of employing flexible resin packages 10 in which the substrate block warps along the circumference of the turning radius, the aforementioned deviations are less likely to occur. Accordingly, rotation can be performed with a larger substrate block than in the case of employing a substrate block composed of non-flexible packages 10. This can increase the number of packages processed at a time.

In step S104, the second resin is preferably cured while settling the second reflecting material 41. It is preferable to use a second reflecting material 41 having a small particle size from the perspective of reflection, but because smaller particles cannot be readily settled, the second reflecting material 41 is artificially settled towards the bottom surface in the recess 15 by using a centrifugal force in this process. In order to cure the resin in the state where the second reflecting material 41 is settled, it is preferable to cure the second resin under rotation, in other words, while rotating the packages, in this process.

It is possible to cure the resin after the rotation has ceased, but once the rotation ceases the wettability of the resin causes the resin to readily spread over the lateral surfaces of the light emitting element 20. Curing the second resin while rotating the package 10 can thus discourage or prevent the second resin from creeping onto the lateral surfaces of the light emitting element 20. Exposure of the lateral surfaces of the light emitting element 20 from the second resin can further increase the light extraction efficiency, and further improve color distribution of light emitted from the light emitting device 100.

The curing temperature for the second resin at this time can be in the range of from 40° C. to 200° C. Increasing the curing temperature can reduce the time required for curing the second resin, and is thus efficient. Considering the wobbling of the axis of the rotation 80 due to thermal expansion generated at the metal parts in the equipment for centrifugal rotation, the curing temperature is preferably as low as possible. That is, the curing temperature for the second resin is preferably 50° C. or higher from the perspective of efficiency. The curing temperature for the second resin is preferably 60° C. at most considering the wobbling of the axis of rotation 80. When curing the resin at a temperature of 80° C. or higher, it is preferable to adjust the equipment for centrifugal rotation such that at least the metal parts of the equipment for centrifugal rotation would not reach 80° C. or higher.

The resin material that composes the second resin is preferably selected from among those that can achieve at least a semi-cured condition when the rotating package 10 is maintained at 40° C. or higher.

Examples of methods for curing the second resin while allowing the second reflecting material 41 to settle include blowing of a hot air, using a panel heater, or the like.

Step of Disposing Phosphor-Containing Layer

In the step S105, the phosphor-containing layer 50 in which a third resin contains a phosphor 51 on the second reflecting layer 40 and the light emitting element 20.

The third resin is disposed in the recess 15 by potting, spraying, or the like. The phosphor 51 naturally settles in the third resin, and is disposed on or above the upper surface of the light emitting element 20, the inner surface of the first reflecting layer 30, and the upper surface of the second reflecting layer 40. Subsequently, the third resin is cured at a temperature of, for example, from 120° C. to 200° C. to form the phosphor-containing layer 50.

The method of manufacturing the light emitting device, and the light emitting device, according to the embodiments of the present disclosure have been explained above based on specific embodiments, but the scope and spirit of the present invention are not limited to those disclosed above, and must be broadly interpreted based on the scope of the claims disclosed herein. Those altered or modified in various ways based on the present disclosure are also encompassed by the scope and spirit of the present invention.

OTHER EMBODIMENT

Figure 5:
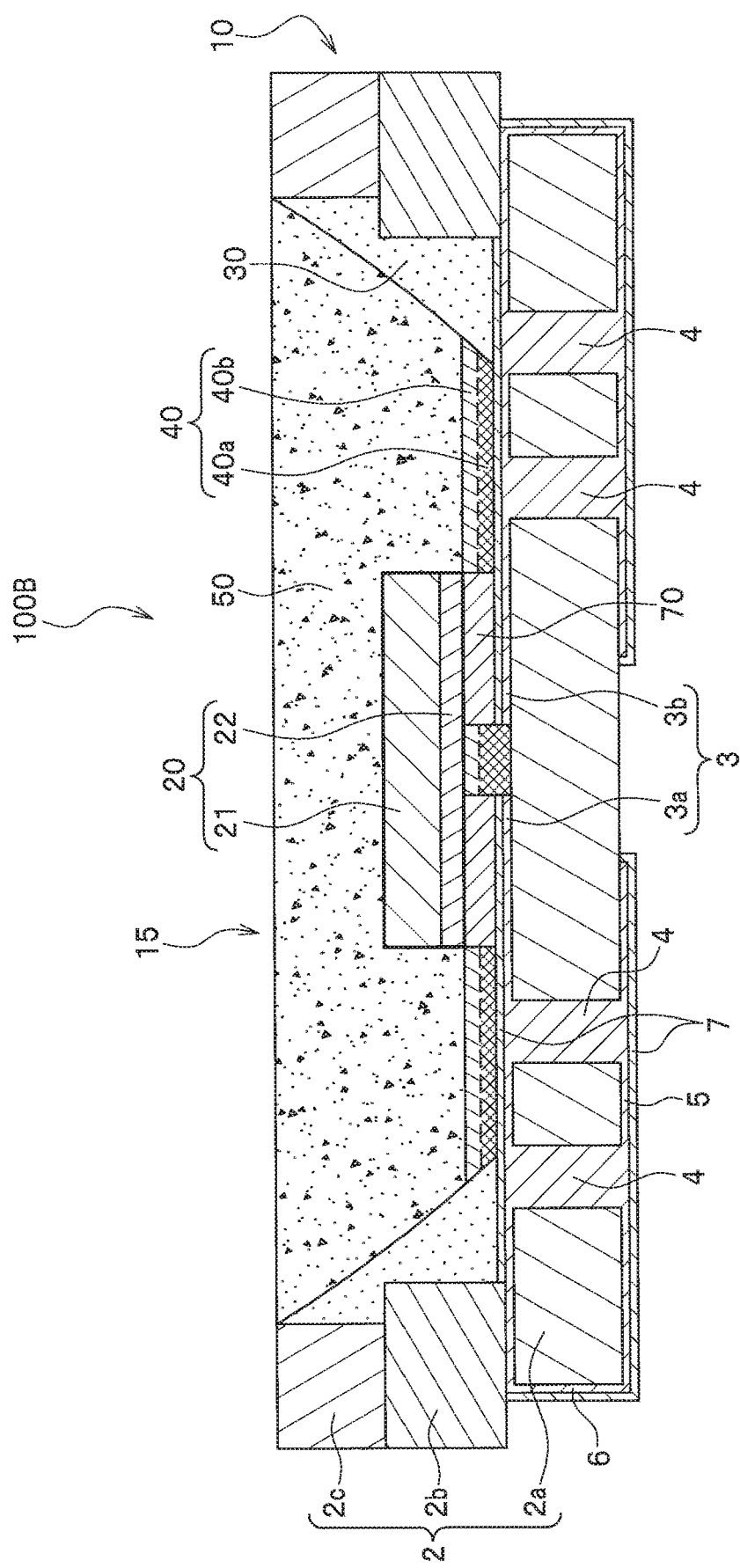
FIG. 5 is a schematic cross-sectional view of the structure of a light emitting device according to still another embodiment.
Figure 6:
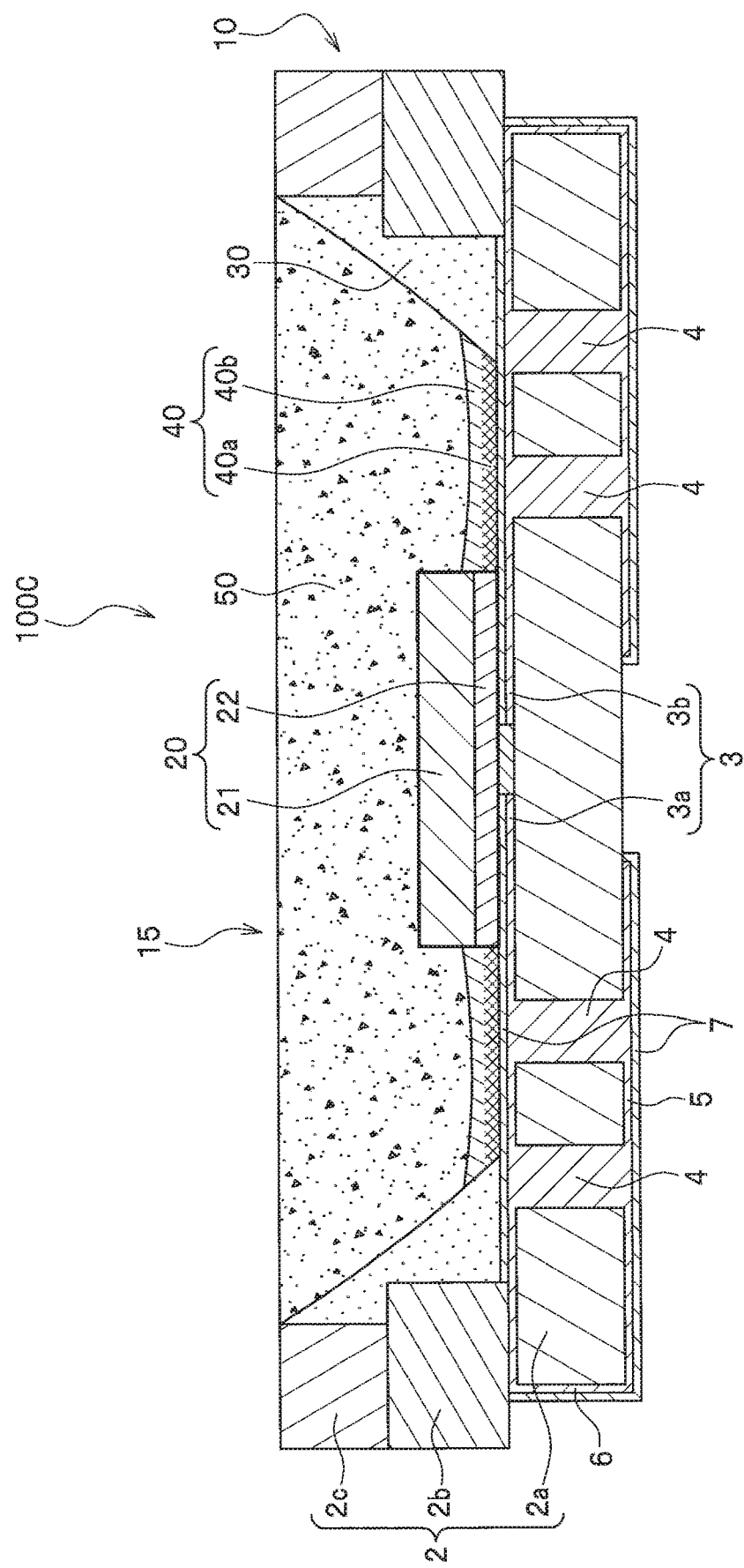
FIG. 6 is a schematic cross-sectional view of the structure of a light emitting device according to still another embodiment.
Figure 7A:
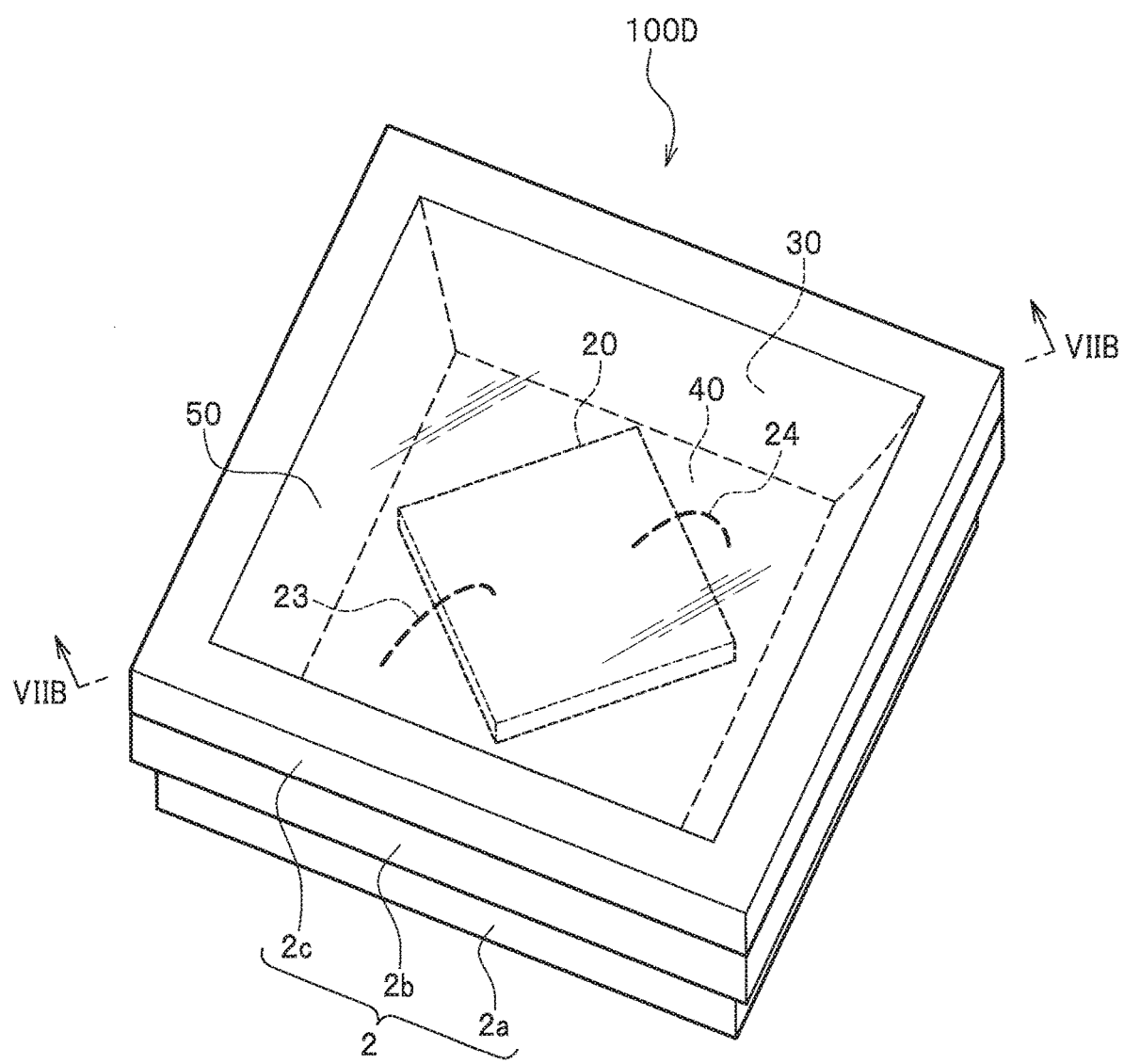
FIG. 7A is a schematic perspective view of the structure of a light emitting device according to still another embodiment.
Figure 7B:
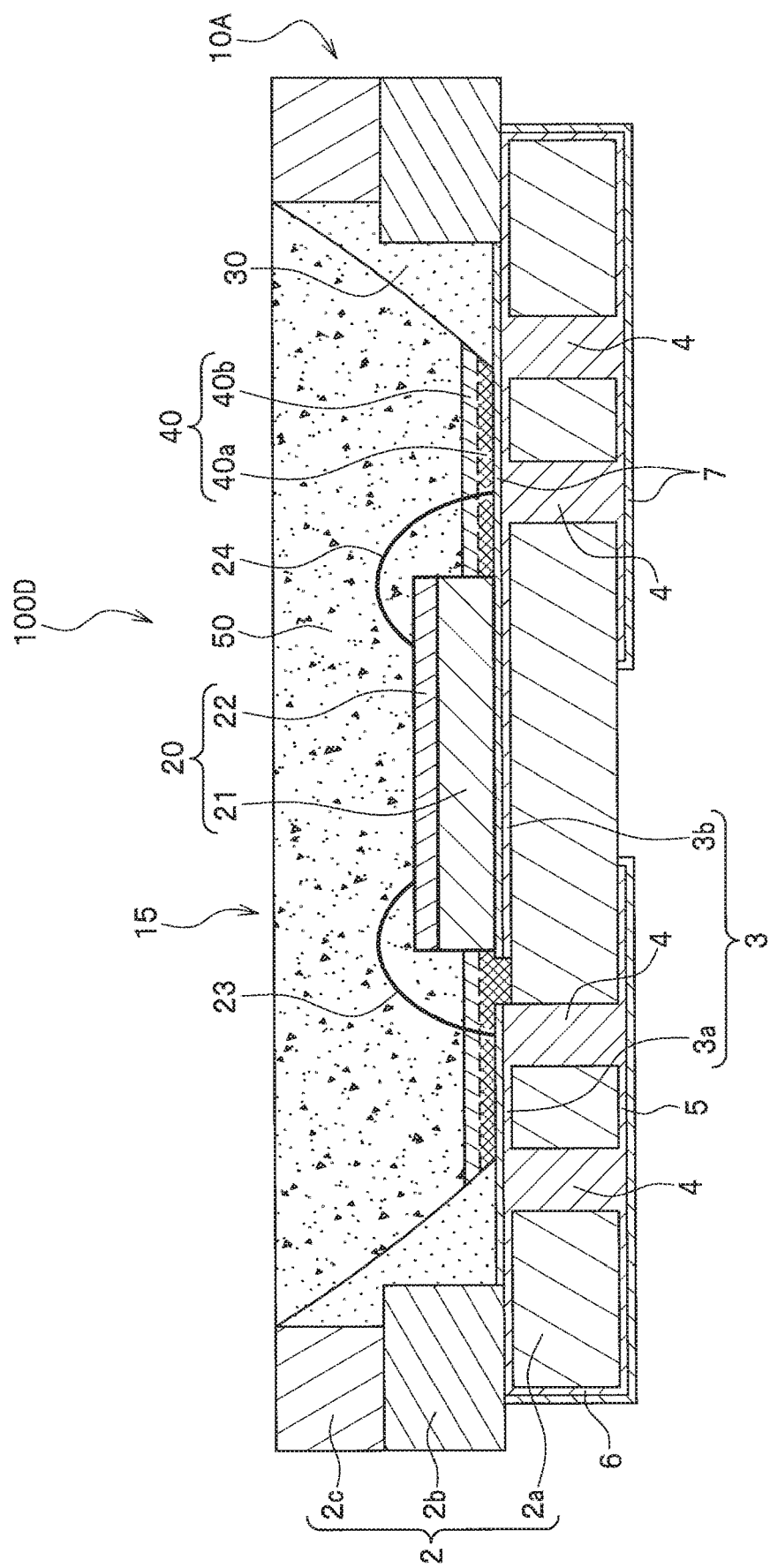
FIG. 7B is a schematic cross-sectional view taken along line VIIB-VIIB in FIG. 7A.
Figure 8A:
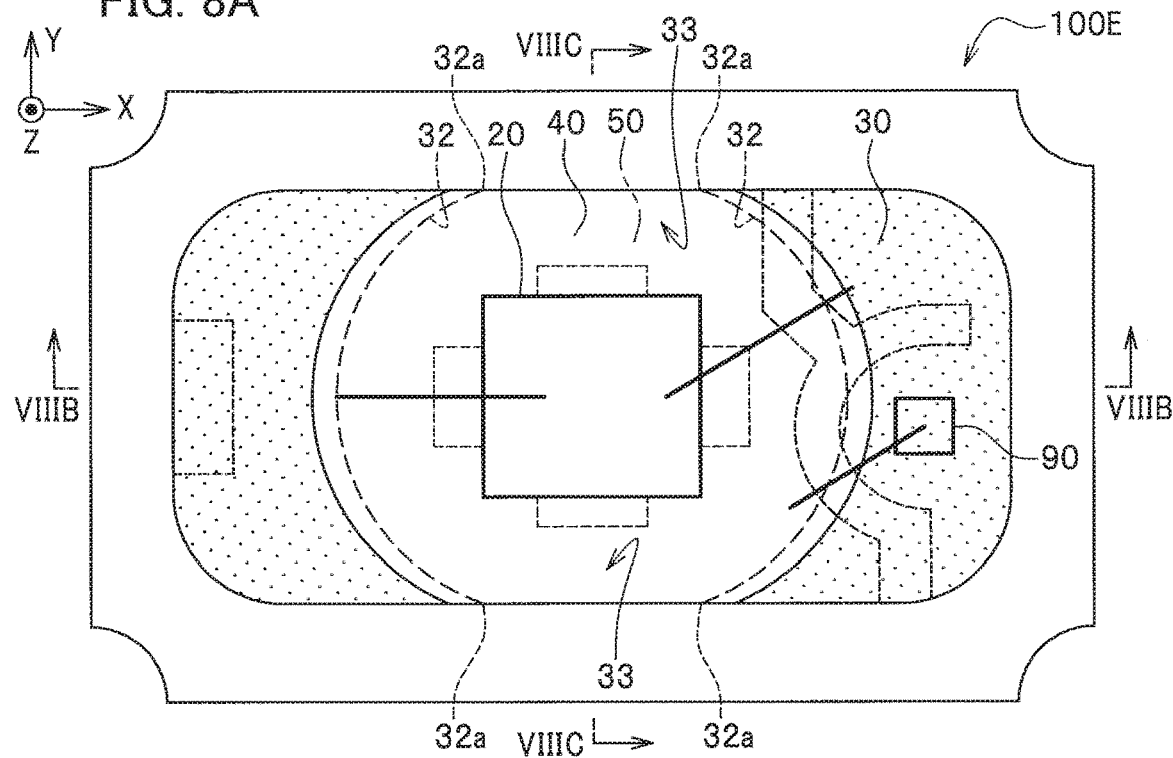
FIG. 8A is a schematic top view of a light emitting device according to still another embodiment.
Figure 8B:
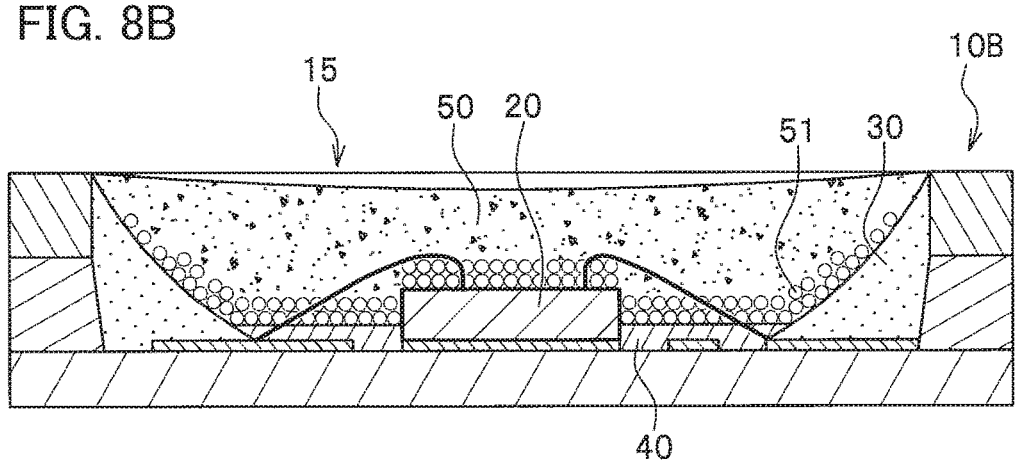
FIG. 8B is a schematic cross-sectional view taken along line VIIIB-VIIIB in FIG. 8A.
Figure 8C:
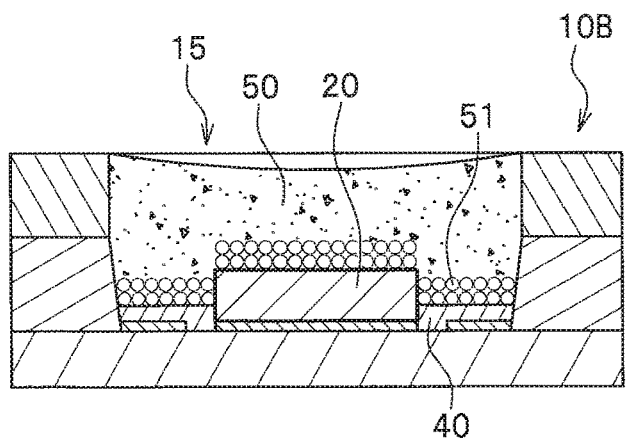
FIG. 8C is a schematic cross-sectional vies taken along line VIIIC-VIIIC in FIG. 8A.
Figure 9A:
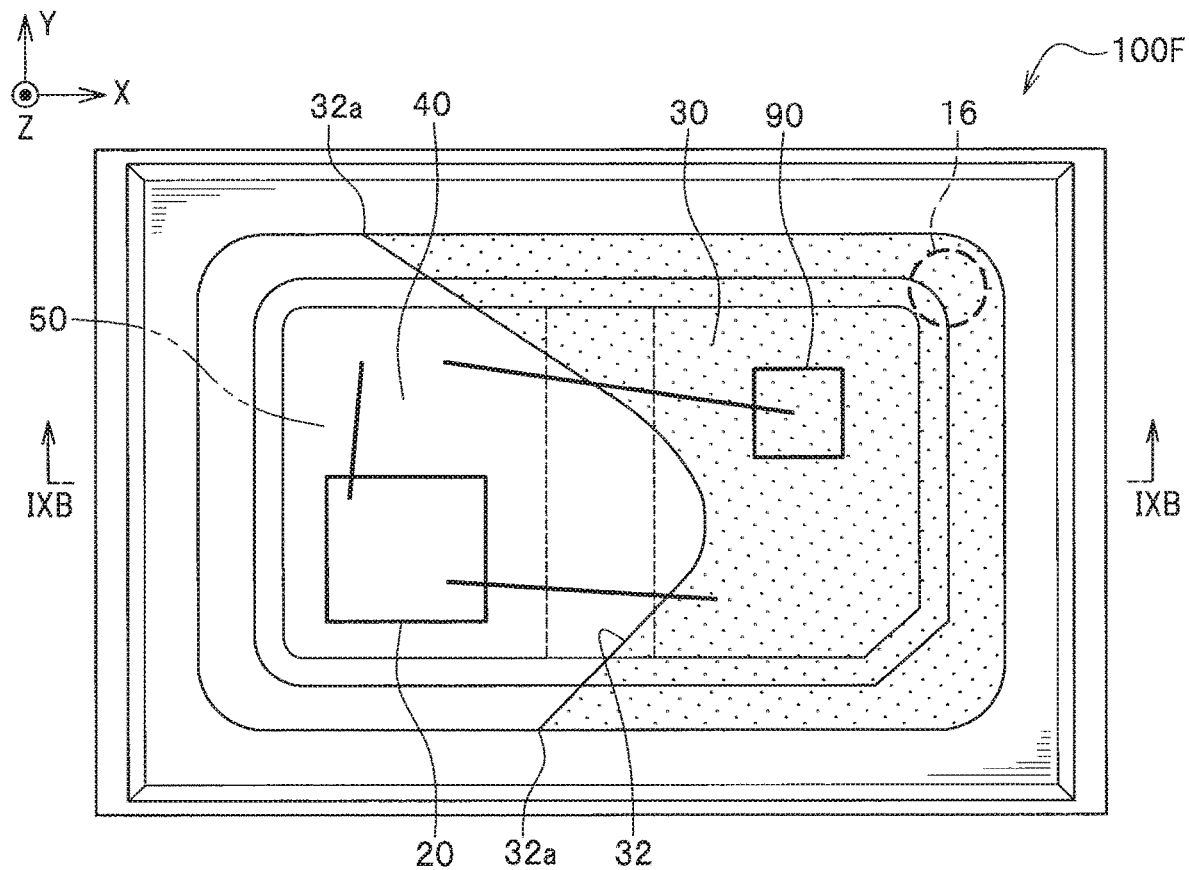
FIG. 9A is a schematic top view of a light emitting device according to still another embodiment.
Figure 9B:
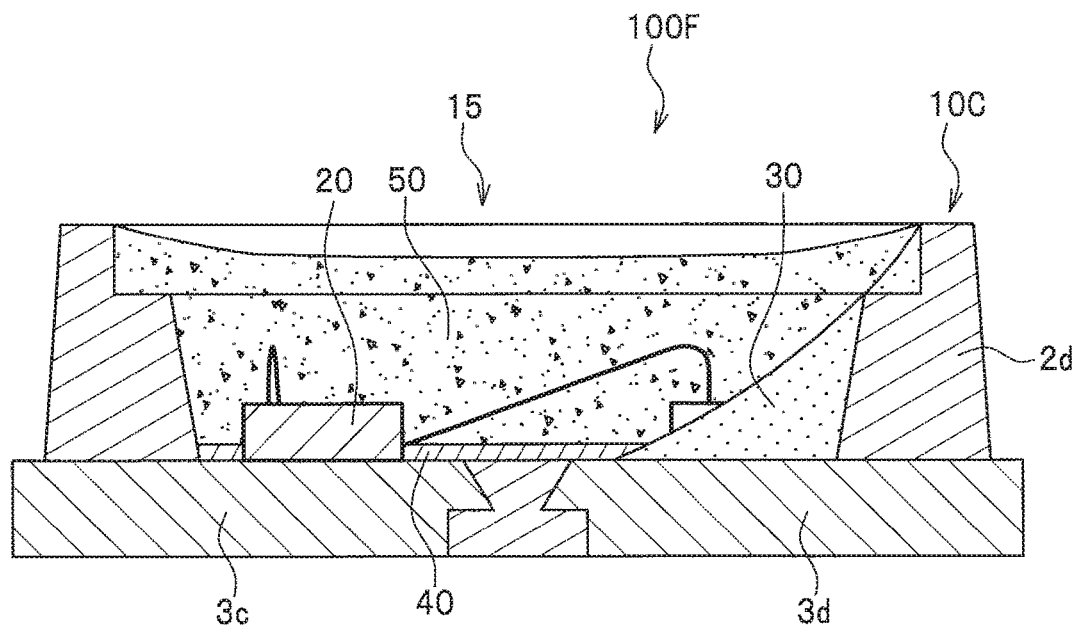
FIG. 9B is a schematic cross-sectional view taken along line IXB-IXB in FIG. 9A.

FIG. 4 is a schematic cross-sectional view of the structure of a light emitting device according to another embodiment. FIG. 5 is a schematic cross-sectional view of the structure of a light emitting device according to still another embodiment. FIG. 6 is a schematic cross-sectional view of the structure of a light emitting device according to still another embodiment. FIG. 7A is a schematic perspective view of the structure of a light emitting device according to still another embodiment. FIG. 7B is a schematic cross-sectional view taken along line VIIB-VIIB in FIG. 7A. FIG. 8A is a schematic top view of a light emitting device according to still another embodiment. FIG. 8B is a schematic cross-sectional view taken along line VIIIB-VIIIB in FIG. 8A. FIG. 8C is a schematic cross-sectional vies taken along line VIIIC-VIIIC in FIG. 8A. FIG. 9A is a schematic top view of a light emitting device according to still another embodiment. FIG. 9B is a schematic cross-sectional view taken along line IXB-IXB in FIG. 9A.

The light emitting device 100A shown in FIG. 4 includes bumps 60 provided between the light emitting element 20 and the bottom surface in the recess 15. In the light emitting device 100A, the light emitting element 20 is mounted on the bottom surface in the recess 15 via the bumps 60. The bumps 60 raise the light emitting element 20 in the height direction of the light emitting element 20. The second reflecting layer 40 is disposed such that the layer 40a containing the second reflecting material 41 does not face the lateral surfaces of the light emitting element 20. The second reflecting layer 40 is disposed such that the semiconductor layer 22 of the light emitting element 20 does not face the reflecting-material-containing layer 40a.

Such a structure can reduce loss of primary light caused by that the primary light is reflected at the lateral surfaces of the light emitting element 20. Increasing the primary light extracted from the lateral surfaces of the light emitting element 20 can reduce multiple excitations of the phosphor 51, thereby further improving the color distribution of light emitted from the light emitting device 100A.

For the bumps 60, for example, Au bumps can be used.

The light emitting device 100B shown in FIG. 5 has posts 70 disposed between the light emitting element 20 and the bottom surface in the recess 15. In the light emitting device 100B, the light emitting element 20 is mounted on the bottom surface in the recess 15 via the posts 70. The posts 70 raise the light emitting element 20 in the height direction of the light emitting element 20. The second reflecting layer 40 is disposed such that the layer 40a containing the second reflecting material 41 does not face the lateral surfaces of the light emitting element 20. The second reflecting layer 40 is disposed such that the semiconductor layer 22 of the light emitting element 20 does not face the reflecting-material-containing layer 40a.

Such a structure can reduce loss of primary light caused by that the primary light is reflected at the lateral surfaces of the light emitting element 20. Increasing the primary light extracted from the lateral surfaces of the light emitting element 20 can reduce multiple excitations of the phosphor 51, thereby further improving the color distribution of light emitted from the light emitting device 100B.

For the posts 70, for example, Cu posts can be used.

In the light emitting device 100C shown in FIG. 6, the second reflecting layer 40 has a concave surface at the opening side. Such a surface condition can be achieved by reducing the rotational speed applied to the package 10. The second reflecting layer 40 may include substantially no light-transmissive layer 40b. Even in this case, by curing the second resin under rotation, in other words, under a centrifugal force, the shape of the second resin can be changed so as to cover the entire bottom surface in the recess 15 exposed from the first reflecting layer 30 while reducing the creeping up of the second reflecting layer 40 onto the lateral surfaces of the light emitting element 20.

Such a structure can reduce loss of primary light caused by that the primary light is reflected at the lateral surfaces of the light emitting element 20. Increasing the primary light extracted from the lateral surfaces of the light emitting element 20 can reduce multiple excitations of the phosphor 51, thereby further improving the color distribution of light emitted from the light emitting device 100C.

The light emitting device 100D shown in FIGS. 7A and 7B is a device in which the light emitting element 20 is face-up mounted on the bottom surface in the recess 15 of the package 10A. The light emitting element 20 is mounted on the second lead 3b. In the present embodiment, the N-side electrode of the light emitting element 20 is connected to a first lead 3a via a wire 23, and the P-side electrode is connected to a second lead 3b via a wire 24.

By mounting the light emitting element 20 with facing up, the semiconductor layer 22 of the light emitting element 20 can be positioned at the light extraction surface side such that the semiconductor layer 22 does not face the reflecting-material-containing layer 40a.

Such a structure can reduce loss of primary light caused by that the primary light is reflected by the lateral surfaces of the light emitting element 20. Increasing the primary light extracted from the lateral surfaces of the light emitting element 20 can reduce multiple excitations of the phosphor 51, thereby further improving color distribution of light emitted from the light emitting device 100D.

A light emitting device 100E shown in FIGS. 8A, 8B and 8C has a rectangular shape in a top view, and defines a recess 15 having a rectangular shape in a top view. That is, the package 10B has lateral surfaces opposing each other in the X direction and other lateral surfaces opposing each other in the Y direction, which is perpendicular to the X direction. A distance between the lateral surfaces opposing each other in the X direction is different from a distance between the lateral surfaces opposing each other in the Y direction. The "rectangular shape" herein includes a shape in which one or more corners are removed, a shape in which one or more corners are rounded, or a substantially rectangular shape. The structure or constituent members of the package 10B are substantially conform to those of the package 10A, therefore the description thereof will not be repeated. In FIG. 8A, curved portions 32 of a first reflecting layer 30 are indicated by dashed lines, and curved portions of a second reflecting layer 40 are indicated by solid lines.

A light emitting element 20 is mounted in the center of the bottom surface in the recess 15. With this structure of the light emitting device 100E, distances between the light emitting element 20 and the lateral surfaces facing in the X direction in the recess 15 is different from distances between the light emitting element 20 and the lateral surfaces facing in the Y direction in the recess 15. That is, in the light emitting device 100E, a distance between the lateral surface of the light emitting element 20 and the lateral surface in the recess 15 in the longitudinal direction of the package 10B is different from a distance between the lateral surface of the light emitting element 20 and the lateral surface in the recess 15 in the width direction of the package 10B. In the present embodiment, the distances between the lateral surfaces of the light emitting element 20 and the lateral surfaces in the recess 15 is made different by the recess 15 to have the rectangular shape in a top view. However, the distances thereof may be made different by the light emitting element 20 to have a rectangular shape. As described above, the package 10B or the light emitting element 20 may be formed such that a distance between one of the lateral surfaces of the light emitting element 20 and one of the lateral surfaces in the recess 15 in the X direction is different from a distance between the other one of the lateral surfaces of the light emitting element 20 and the other one of the lateral surfaces in the recess 15 in the Y direction.

The first reflecting layer 30 has curved portions 32 each having a concave shape toward the light emitting element 20. The curved portions 32 extend in the X direction in a top view. The first reflecting layer 30 defines a gap 33 such that at least a portion of the lateral surfaces in the recess 15 faces the light emitting element 20 in the Y direction.

The curved portions 32 of the first reflecting layer 30 are positioned opposite sides of the package 10B in the X direction in a top view, in other words, one side (i.e., left side of the drawing) and the other side (i.e., right side of the drawing) of the package 10B. With this structure, the first reflecting layer 30 covers the shorter lateral surfaces in the recess 15. The covered portions 32 are formed such that its concave portions respectively face substantially the center of the lateral surfaces of the light emitting element 20. Specifically, the deepest portion of the concaved portion of each of the concaved portions 23 faces substantially the center of the corresponding lateral surface of the light emitting element 20.

Portions of the gap 33 of the first reflecting layer 30 positioned at one side (i.e., upper side of the drawing) and the other side (i.e., lower side of the drawing) in the Y direction are defined such that substantially no first reflecting layer 30 is provided at the portions where the light emitting element 20 faces. Specifically, ends 32a of each of the curved portions 32 are positioned on or outward of the extended line of the corresponding lateral surfaces of the light emitting element 20. Each of the lateral surface facing in the Y direction in the recess 15 has a portion that faces the light emitting element 20. Such portion of each of the lateral surfaces in the recess 15 faces the phosphor-containing layer 50, but not faces the first reflecting layer 30.

With such a structure, substantially no first reflecting layer 30 is provided on the portion of the lateral surface in the recess 15 facing in the Y direction with which a distance from the lateral surface of the light emitting element 20 is shorter. Thus substantially no part of the second reflecting layer 40 overlaps the first reflecting layer 30. Accordingly, the surface of the second reflecting layer 40 extending in the Y direction can be good flatness. This surface flatness, for example, allows the layer configuring the settled phosphor 51 to be good flatness after settling the phosphor 51 in the third resin. In the case in which the distance between the light emitting element 20 and the first reflecting layer 30 is short, and the second reflecting layer 40 overlaps the first reflecting layer 30, the phosphor 51 adjacent to the lateral surfaces of the light emitting element 20 possibly be disposed at a position higher than the light emitting element 20. This may increase ratio of the secondary light that is light converted by the phosphor 51, possibly result in color non-uniformity in the emitted light.

That is, a certain distance or more can be secured between the outer periphery of the light emitting element 20 and the first reflecting layer 30 (or the lateral surfaces on which substantially no first reflecting layer 30 is provided in the recess 15), to thereby making the second reflecting layer 40 flat at the outer periphery and its vicinity of the light emitting element 20. Thus, the phosphor-containing layer 50 may be positioned at the lower area on the second reflecting layer 40 in a top view. This can improve the light distribution and color distribution of light emitted from the light emitting device 100E. From the perspective of the above description, the distance between the light emitting element 20 and the first reflecting layer 30 in a top view is preferably at least 100 μm, more preferably at least 300 μm. From the perspective of facilitating the second reflecting layer 20, the distance between the light emitting element 20 and the first reflecting layer 30 is preferably 1500 μm or less.

The state of the first reflecting layer 30 may be controlled by adjusting the discharging amount of the first resin containing the first reflecting material 31, the position where the first resin is discharged, or the amount of the first reflecting material 31 contained in the first resin. Amount adjustment of the first reflecting material 31 contained in the first resin can be achieved by, for example, adding Aerosil® of at least 2.0 parts by mass and 6.5 parts by mass at most relative to 100 parts by mass of the first resin.

In the present embodiment, the first reflecting layer 30 defines the gap 33 at the lateral surfaces facing in the Y direction in the recess 15, and is absent on portions that face the light emitting element 20. However, the first reflecting layer 30 may be absent only on portions of the lateral surfaces facing in the Y direction in the recess 15 that face the light emitting element 20. As well as portions of the lateral surfaces in the recess 15 that face the light emitting element 20 in the Y direction, the first reflecting layer 30 may be absent on portions of the lateral surfaces in the recess 15 that do not face the light emitting element 20. The gap 33 may be adjusted by changing the positions of the ends 32a of the curved portions 32 along the lateral surfaces facing in the Y direction in the recess 15.

The light emitting device 100E includes a protection device 90. The protection device 90 may be, for example, Zener diode.

The light emitting device 100F shown in FIGS. 9A and 9B has a rectangular shape in a top view, and defines a recess 15 having a rectangular shape in a top view. The package 10C includes a support member 2b, a pair of first lead 3c and a second lead 3d. The support member 2b supports the first lead 3c and the second lead 3d at a predetermined position. The support member 2d may be formed using, for example, the same material of the insulating substrate 2 of the light emitting device 100. The first lead 3c and the second lead 3d may be formed using, for example, the same material of the first wiring portions 3 in the light emitting device 100. FIG. 9A is a diagram seeing through the second reflecting layer 40, and a curved portion 32 of a first reflecting layer 30 is indicated by solid lines.

The light emitting element 20 is disposed on a portion of the bottom surface where is shifted to one side from the center in the recess 15. In the present disclosure, the light emitting element 20 is disposed at a position shifted from the center of the bottom surface in the recess 15 to one side in the X direction (e.g., left side in FIG. 9A) and to one side in the Y direction perpendicular to the X direction (e.g., lower side in FIG. 9A). Specifically, the light emitting element 20 is disposed on the first lead 3c while being positioned at an obliquely downward to the left from the center in the recess 15 in the drawing.

The first reflecting layer 30 defines the curved portion 32 being curved from one lateral surface extending in one direction toward other lateral surface facing the one lateral surface in the recess 15 in a top view. Specifically, the curved portion 32 of the first reflecting layer 30 are curved form one lateral surface extending in the X direction toward other lateral surface facing the one lateral surface (i.e., right side in FIG. 9A) in the recess 15 in a top view. That is, the curve of the curved portion 32 start from one lateral surface toward other lateral surface facing in the Y direction in order to have a concave shape toward the light emitting element 20 in the X direction in a top view. With this structure, the first reflecting layer 30 covers the aforementioned other lateral surface that is one of the shorter lateral surfaces in the recess 15. One of the ends 32a of the curved portion 32 is located at a position on one side where the light emitting element 20 face in the Y direction. The other one of the ends 32a of the curved portion 32 is not located at a position of the other side where the light emitting element 20 faces in the Y direction. Thus, the first reflecting layer 30 is disposed on the lateral surfaces in the recess 15 so as to face most part of adjacent two lateral surfaces of the light emitting element 20, and to not face the other two of adjacent lateral surfaces of the light emitting element 20. The deepest portion of the curved portion 32 faces the light emitting element 20.

The ends 32a of the curved portion 32 extends toward portions of the lateral surfaces facing each other in the Y direction in the recess 15. Specifically, in the recess 15, one of the ends 32a on the lateral surface (e.g., upper side in FIG. 9A) is located in a position closer to one of the lateral surfaces facing in the X direction than the other one of the ends 32a on the lateral surface (e.g., lower side in FIG. 9A) facing the aforementioned lateral surface in the Y direction. Accordingly, the curved portion 32 can be formed such that the deepest portion of the curve faces the light emitting element 20.

With this structure, in regard to the lateral surfaces facing each other in the X direction in the recess 15, a relatively long distance can be ensured from one lateral surface of the light emitting element 20 facing the deepest portion of the curved portion to the one lateral surface of the first reflecting layer 30, thereby improving color distribution of light emitted from the light emitting device 100F.

The state of the first reflecting layer 30 may be controlled by adjusting the discharging amount of the first resin containing the first reflecting material 31, the position where the first resin is discharged, or the amount of the first reflecting material 31 contained in the first resin. When the discharging position is adjusted, the first resin is preferably discharged at a discharging position 16.

In the light emitting device 100E shown in FIG. 8A, 8B, 8C or the light emitting device 100F shown in FIG. 9A, 9B, the curved portion 32 may have a large or small curvature radius. The curved portion 32 may be a portion of a circular arc. The deepest portion of the curved portion 32 may appropriately be shifted in the X or Y direction.

The method of manufacturing a light emitting device may include another step between the steps described above or before or after the steps described above to the extent it does not adversely affect the steps described above. For example, a step of removing foreign substances mixed in during the manufacturing process, or the like, can be included.

In the method of manufacturing a light emitting device, moreover, some steps are not restricted by the order in which they are performed, and may be performed in reverse order. For example, the step of mounting the light emitting element may be performed after the step of forming the first reflecting layer.

Furthermore, in the method of manufacturing a light emitting device described above, the step of providing the second resin followed by the step of forming the first reflecting layer, but the step of providing the second resin may be performed between the step of mounting the light emitting element and the step of forming the first reflecting layer, or before the step of mounting the light emitting element. The method does not have to include the step of providing the second resin.

What is claimed is:

1. A method of manufacturing a light emitting device, the method comprising:
    mounting a light emitting element in a package in which a recess is defined, the light emitting element being mounted on a bottom surface defining the recess;
    forming a first reflecting layer by covering a lateral surface defining the recess with a first resin containing a first reflecting material;
    forming a second reflecting layer covering the bottom surface defining the recess, wherein:
        the step of forming the second reflecting layer comprises settling a second reflecting material in a second resin by a centrifugal force so as to form (i) a layer containing the second reflecting material on the bottom surface defining the recess, and (ii) a light-transmissive layer above the layer containing the second reflecting material,
        after the step of forming the second reflecting layer, the second reflecting layer contacts the first reflecting layer and a lower portion of a lateral surface of the light emitting element, but does not contact an upper portion of the lateral surface of the light emitting element, and
        after the step of forming the second reflecting layer, an entirety of the second reflecting layer is located below a plane in which an upper surface of the light emitting element extends; and
    disposing a phosphor-containing layer on the second reflecting layer and the light emitting element, such that the phosphor-containing layer is in contact with the upper portion of the lateral surface of the light emitting element, wherein the phosphor-containing layer comprises a third resin that contains a phosphor.

2. The method of manufacturing a light emitting device according to claim 1, wherein the second reflecting material is settled by applying the centrifugal force to the package about an axis of rotation such that the bottom surface defining the recess is positioned outward of the axis of rotation.

3. The method of manufacturing a light emitting device according to claim 1, wherein the step of forming the second reflecting layer comprises curing the second resin while settling the second reflecting material.

4. The method of manufacturing a light emitting device according to claim 3, wherein the second resin is cured at a temperature in a range of 40° C. to 200° C.

5. The method of manufacturing a light emitting device according to claim 1, wherein the second reflecting material comprise titanium oxide.

6. The method of manufacturing a light emitting device according to claim 5, wherein a particle size of the titanium oxide is in a range of 0.1 μm to 1.0 μm.

7. The method of manufacturing a light emitting device according to claim 1, wherein a viscosity of the second resin is in a range of 0.3 Pa·s to 15 Pa·s.

8. The method of manufacturing a light emitting device according to claim 1, further comprising:
    before the step of forming the second reflecting layer, forming the second resin containing the second reflecting material by performing steps comprising:
        mixing a base resin of a curable resin material and the second reflecting material to form a mixture, and
        after allowing at least two hours to elapse, mixing a curing agent into the mixture.

9. A method of manufacturing a light emitting device, the method comprising:
    mounting a light emitting element in a package in which a recess is defined, the light emitting element being mounted on a bottom surface defining the recess;
    forming a first reflecting layer by covering a lateral surface defining the recess with a first resin containing a first reflecting material;
    forming a second reflecting layer by covering the bottom surface defining the recess with a second resin containing a second reflecting material, wherein:
        the step of forming the second reflecting layer comprises:
            disposing the second resin on the bottom surface in the recess at a position between the lateral surface defining the recess and the light emitting element, by potting,
            applying a centrifugal force to the package about an axis of rotation such that the bottom surface defining the recess is positioned outward of the axis of rotation, so as to change a shape of the second resin such that the second resin covers an entirety of the bottom surface defining the recess that is exposed from the first reflecting layer, and curing the second resin while applying the centrifugal force, after the step of forming the second reflecting layer, the second reflecting layer contacts the first reflecting layer and a lower portion of a lateral surface of the light emitting element, but does not contact an upper portion of the lateral surface of the light emitting element, and after the step of forming the second reflecting layer, an entirety of the second reflecting layer is located below a plane in which an upper surface of the light emitting element extends;

disposing a phosphor-containing layer on the second reflecting layer and the light emitting element, such that the phosphor-containing layer is in contact with the upper portion of the lateral surface of the light emitting element, wherein the phosphor-containing layer comprises a third resin that contains a phosphor.

10. The method of manufacturing a light emitting device according to claim 9, wherein the second resin is cured at a temperature in a range of 40° C. to 200° C.

11. The method of manufacturing a light emitting device according to claim 9, wherein the second reflecting material comprise titanium oxide.

12. The method of manufacturing a light emitting device according to claim 11, wherein a particle size of the titanium oxide is in a range of 0.1 μm to 1.0 μm.

13. The method of manufacturing a light emitting device according to claim 9, wherein a viscosity of the second resin is in a range of 0.3 Pa·s to 15 Pa·s.

14. The method of manufacturing a light emitting device according to claim 9, further comprising:

before the step of forming the second reflecting layer, forming the second resin containing the second reflecting material by performing steps comprising:

mixing a base resin of a curable resin material and the second reflecting material to form a mixture, and after allowing at least two hours to elapse, mixing a curing agent into the mixture.

15. A method of manufacturing a light emitting device, the method comprising:

mounting a light emitting element in a package in which a recess is defined, the light emitting element being mounted on a bottom surface defining the recess;

forming a first reflecting layer by covering a lateral surface defining the recess with a first resin containing a first reflecting material;

forming a second resin containing a second reflecting material by performing steps comprising:

mixing a base resin of a curable resin material and the second reflecting material to form a mixture, and after allowing at least two hours to elapse, mixing a curing agent into the mixture;

forming a second reflecting layer covering the bottom surface defining the recess, such that the second reflecting layer contacts the first reflecting layer, wherein the step of forming the second reflecting layer comprises settling the second reflecting material in the second resin by a centrifugal force so as to form (i) a layer containing the second reflecting material on the bottom surface defining the recess, and (ii) a light-transmissive layer above the layer containing the second reflecting material, and wherein at least a portion of a lateral surface of the light emitting element is not covered by the layer containing the second reflecting material; and disposing a phosphor-containing layer on the second reflecting layer and the light emitting element, the phosphor-containing layer comprising a third resin that contains a phosphor.

16. A method of manufacturing a light emitting device, the method comprising:

mounting a light emitting element in a package in which a recess is defined, the light emitting element being mounted on a bottom surface defining the recess;

forming a first reflecting layer by covering a lateral surface defining the recess with a first resin containing a first reflecting material;

forming a second resin containing a second reflecting material by performing steps comprising:

mixing a base resin of a curable resin material and the second reflecting material to form a mixture, and after allowing at least two hours to elapse, mixing a curing agent into the mixture;

forming a second reflecting layer by covering the bottom surface defining the recess with the second resin containing the second reflecting material, such that the second reflecting layer contacts the first reflecting layer, wherein the step of forming the second reflecting layer comprises:

disposing the second resin on the bottom surface in the recess at a position between the lateral surface defining the recess and the light emitting element, by potting, applying a centrifugal force to the package about an axis of rotation such that the bottom surface defining the recess is positioned outward of the axis of rotation, so as to change a shape of the second resin such that the second resin covers an entirety of the bottom surface defining the recess that is exposed from the first reflecting layer, and curing the second resin while applying the centrifugal force;

disposing a phosphor-containing layer on the second reflecting layer and the light emitting element, wherein the phosphor-containing layer comprises a third resin that contains a phosphor.

* * * * *